(12) United States Patent
Kai et al.

(10) Patent No.: US 6,327,211 B1
(45) Date of Patent: Dec. 4, 2001

(54) INVERTER HAVING A VARIABLE THRESHOLD POTENTIAL

(75) Inventors: Yoshihide Kai; Kazuo Kobayashi, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/769,414

(22) Filed: Jan. 26, 2001

(30) Foreign Application Priority Data

Jun. 12, 2000 (JP) .................................................. 12-174845

(51) Int. Cl.$^7$ ...................................................... G11C 7/00
(52) U.S. Cl. .................. 365/225.7; 365/230.03; 365/230.06; 365/189.01
(58) Field of Search .......................... 365/225.7, 230.03, 365/230.06, 189.01, 230.08, 189.05

(56) References Cited

U.S. PATENT DOCUMENTS 6,067,268 * 5/2000 Lee ...................................... 365/225.7

FOREIGN PATENT DOCUMENTS 8-316327    11/1996    (JP) .

* cited by examiner

*Primary Examiner*—David Nelms
*Assistant Examiner*—David Lam
(74) *Attorney, Agent, or Firm*—McDermott, Will & Emery

(57) ABSTRACT

In an inverter, each source of first to third P-channel MOS transistors is connected to a line of a source potential, a drain of the first P-channel MOS transistor is connected to an output node, each of first and second fuses is connected between each drain of the second and third P-channel MOS transistors and the output node, an N-channel MOS transistor is connected between the output node and a ground potential line, and each gate of these four MOS transistors is connected to an input node. At least one of the first and second fuses is blown out, and thereby, it is possible to reduce a threshold potential voltage of the inverter.

19 Claims, 16 Drawing Sheets

WRITE

ERASE

FIG.14
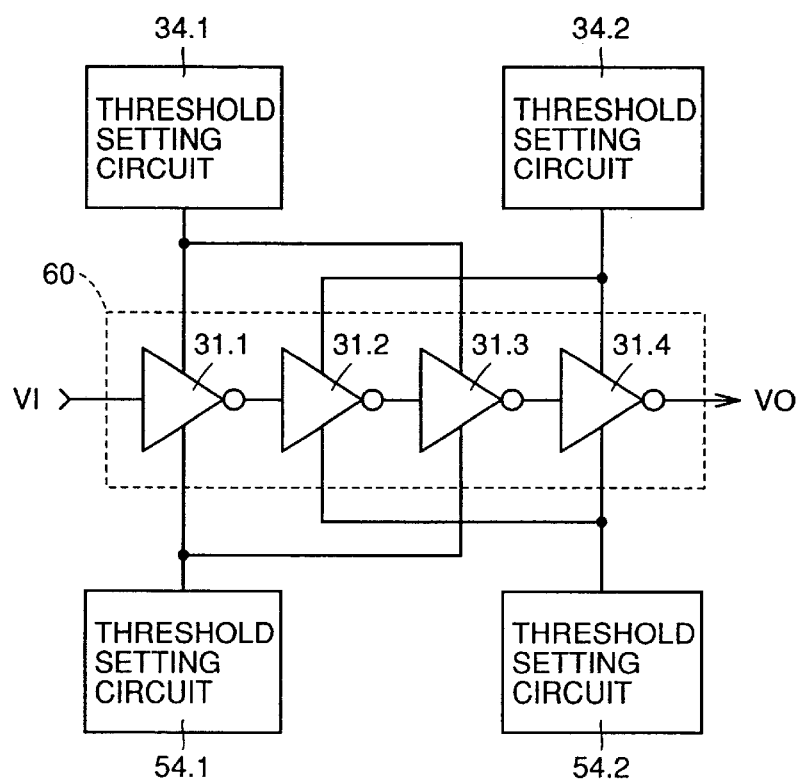
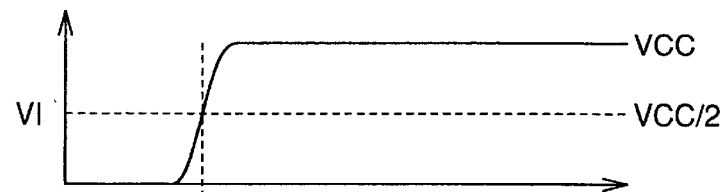
FIG.15A  VI
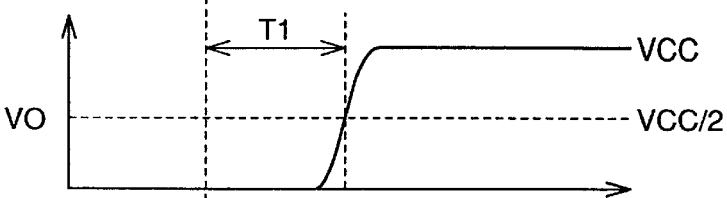
FIG.15B  VO
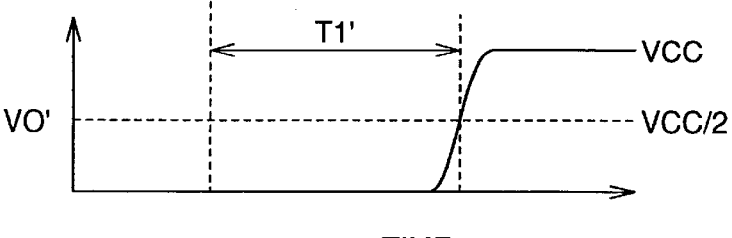
FIG.15C  VO'
TIME t FIG. 16
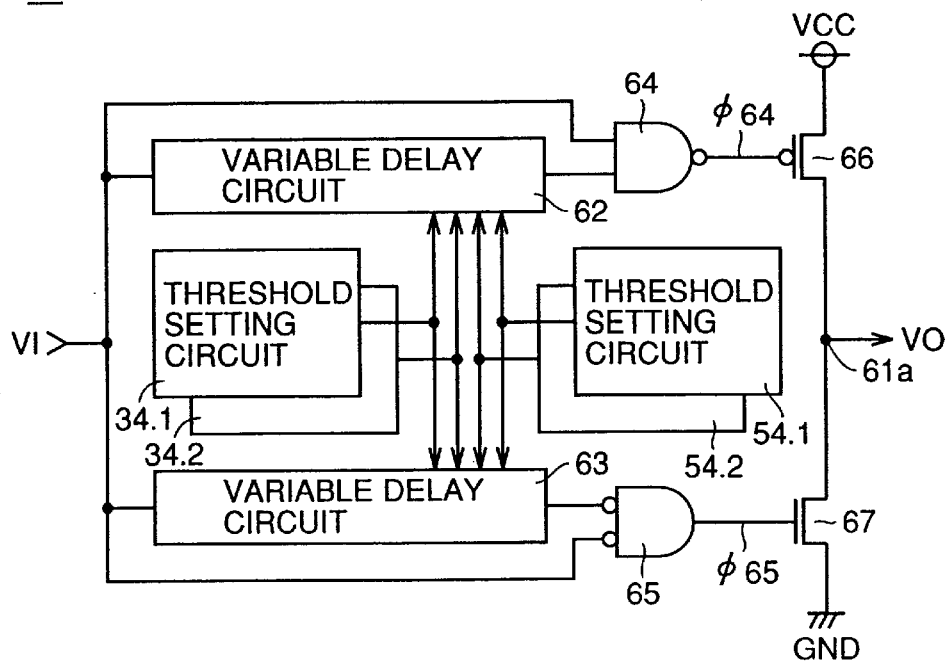
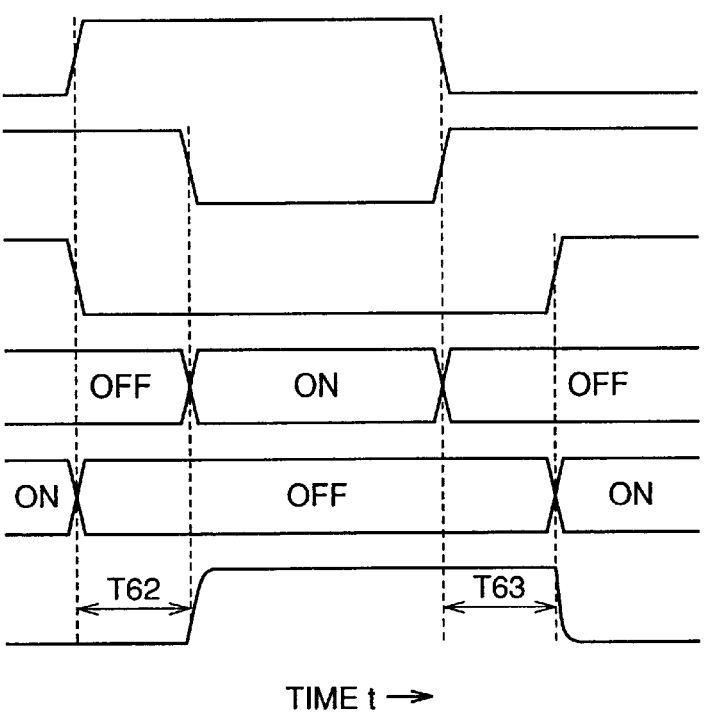

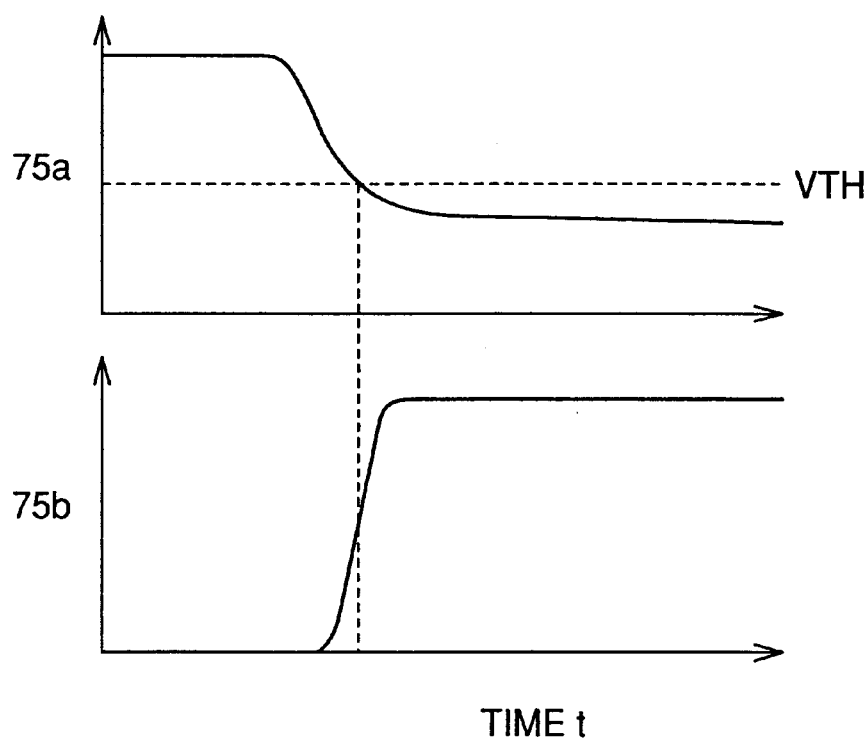
FIG.19A
FIG.19B
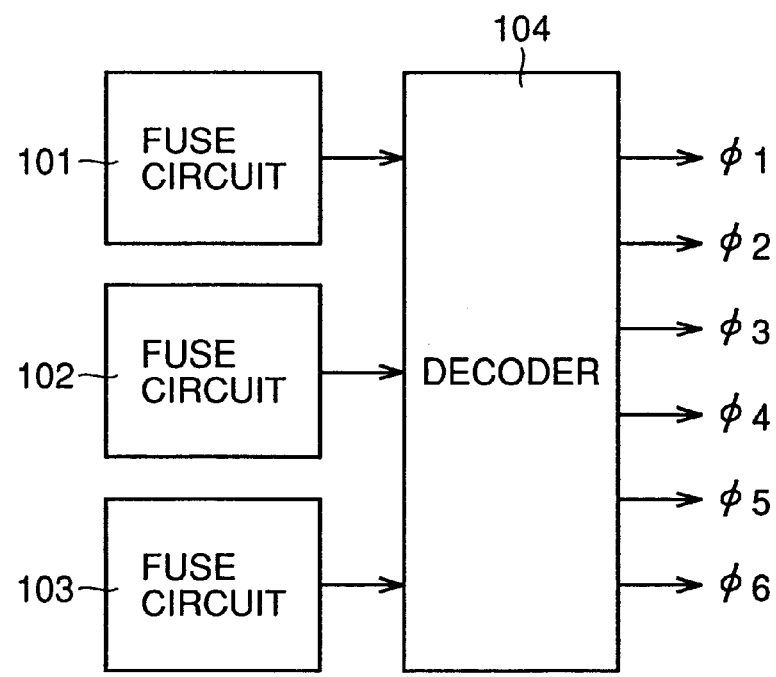
FIG.20

INVERTER HAVING A VARIABLE THRESHOLD POTENTIAL

BACKGROUND OF THE INVENTION

1. Field of the Invention

The present invention relates to an inverter, in particular, to an inverter which has a variable threshold potential.

2. Description of the Background Art

Conventionally, in a semiconductor integrated circuit, such as a flash memory, many inverters have been used in order to carry out a signal level detection, a signal transmission, a signal delay and the like. An inverter outputs an "H" level in case that an input signal level is lower than a threshold potential VTH, and outputs an "L" level in case that the input signal level is higher than the threshold potential VTH. However, for various reasons, there are some cases that the threshold potential VTH of a manufactured inverter diverges from its design value.

In the prior art, as shown in FIG. 22, a plurality (three in FIG. 22) of P-channel MOS transistors 121 to 123 and an N-channel MOS transistor 124 are formed so as to constitute an inverter. First, the P-channel MOS transistor 121 and the N-channel MOS transistor 124 configure an inverter, which functions to measure a threshold potential VTH of the inverter. On the basis of the measurement result, any one of a plurality of masks is selected and, if necessary, the P-channel MOS transistor 122 and/or 123 has been connected in parallel to the P-channel MOS transistor 121 in order that a threshold potential VTH of the inverter is adjusted.

However, in the prior art, a plurality of masks have to be prepared in advance, which results in taking significant amount of time and labor. Moreover, a wafer manufacturing process is temporally interrupted to measure a threshold potential VTH of a manufactured inverter, and a mask is selected and set based on the measurement result, which results in taking significant amount of time and labor.

SUMMARY OF THE INVENTION

The present invention has been made taking the aforesaid problem in the prior art into consideration. It is, therefore, a principal object of the present invention to provide an inverter which its threshold potential can be changed in a simple manner at a low cost.

According to one aspect of the present invention, a first transistor of a first conductive type is connected between a line of a first source potential and an output node, a second transistor of a second conductive type is connected between a line of a second source potential and the output node, a third transistor of a second conductive type and a fuse are connected between a line of a second source potential and the output node, and each input electrode of the first to third transistors is connected to an input node. Therefore, the fuse is blown out, and thereby, a threshold potential of the inverter is changed, so that the threshold potential of the inverter can be changed in a simpler manner at a low cost as compared with the conventional case where the threshold potential of the inverter has been changed by exchanging masks.

Preferably, the third transistor and the fuse are provided in plural sets, and current driving forces of a plurality of the third transistors are set to values different from each other. In this case, it is possible to change the threshold potential of the inverter into more variety of steps.

According to another aspect of the present invention, a first transistor of a first conductive type is connected between a line of a first source potential and an output node, a second transistor of a second conductive type and a first variable resistor circuit are connected in series between the output node and a line of a second source potential, and the inverter is provided with a first threshold setting circuit including at least one first fuse, and, by setting a resistance value of the first variable resistor circuit on the basis of the result whether or not the first fuse is blown out, setting a threshold potential of the inverter. Therefore, by blowing out the fuse, a threshold potential of the inverter can be changed, so that the threshold potential of the inverter can be more simply changed at a lower cost as compared with the conventional case where the threshold potential of the inverter has been changed by exchanging masks.

Preferably, the first variable resistor circuit include a plurality of the third transistors of the second conductive type which are connected in parallel between one electrode of the second transistor and the line of the second source potential, and the first threshold setting circuit make each of the third transistors conductive or nonconductive on the basis of the result whether or not the first fuse is blown out. Therefore, in this case, it is possible to readily constitute the first variable resistor circuit, and to easily set the resistance value of the first variable resistor circuit.

Preferably, current driving forces of a plurality of the third transistors are set to values different from each other. Therefore, in this case, it is possible to change the threshold potential of the inverter into more variety of steps.

Further, preferably, the first fuse is provided so as to correspond to each of the third transistors, and the first threshold setting circuit make the corresponding third transistors conductive or nonconductive in accordance with the result that the first fuse is blown out. Therefore, in this case, it is possible to readily constitute the first threshold setting circuit.

Further, preferably, the first fuse is provided fewer than a number of the third transistors, the first threshold setting circuit include a first decoder which outputs a plurality of first control signals of the same number as the third transistors on the basis of the result whether or not the first fuse is blown out, and a plurality of the third transistors become conductive or nonconductive in response to a plurality of the first control signals. Therefore, in this case, it is possible to change the threshold potential of the inverter in a multi-step by fewer first fuses.

Further preferably, the inverter further includes: a second variable resistor circuit which is interposed between one electrode of the first transistor and the line of the first source potential; and at least one second fuse, and a second threshold setting circuit are provided, which set a threshold potential of the inverter by setting the resistance value by the second variable resistor circuit on the basis of the result whether or not the second fuse is blown out. Therefore, in this case, it is possible to make the threshold potential of the inverter higher or lower.

Further preferably, the second variable resistor circuit include a plurality of fourth transistors of first conductive type which are connected in parallel between one electrode of the first transistor and the line of the first source potential, and the second threshold setting circuit make each of the fourth transistors conductive or nonconductive on the basis of the result whether or not the second fuse is blown out. Therefore, in this case, it is possible to readily constitute the second variable resistor circuit, and to easily set the resistance value of the second variable resistor circuit.

Further preferably, current driving forces of a plurality of the fourth transistors are set to values different from each other. Therefore, in this case, it is possible to change the threshold potential of the inverter into even more variety of steps.

Further preferably, the second fuse is provided so as to correspond to each of the fourth transistors, and the second threshold setting circuit make the corresponding fourth transistors conductive or nonconductive in accordance with the result that the first fuse is blown out. Therefore, in this case, it is possible to readily constitute the second threshold setting circuit.

Further preferably, the second fuse is provided fewer than a number of the fourth transistors, the second threshold setting circuit include a second decoder which outputs a plurality of second control signals of the same number as the fourth transistors on the basis of the result whether or not the second fuse is blown out, and a plurality of the fourth transistors become conductive or nonconductive in response to a plurality of the second control signals. Therefore, in this case, it is possible to change the threshold potential of the inverter in a multi-step by fewer second fuse.

Further preferably, the inverter is provided in a plural number, and a plurality of inverters are connected in series so as to constitute a variable delay circuit. Therefore, in this case, it s possible to change a delay time of the variable delay circuit on the basis of the result whether or not the first and second fuses are blown out.

Further preferably, the first and second variable resistor circuits and the first and second threshold setting circuits of the inverters other than first and second stage inverters of a plurality of the inverters are omitted. The first and second variable resistor circuits of the first stage inverter and the first and second threshold setting circuits are used in common on the odd-numbered stage inverters. The first and second variable resistor circuit of the second stage inverter and the first and second threshold setting circuit are used in common to even-numbered stage inverters. Therefore, in this case, it is possible to reduce the number of fuses, resulting in making a layout area smaller.

Further preferably, variable delay circuits are provided two sets in an output buffer of the semiconductor device. One of the variable delay circuits generates a first signal by delaying a leading edge of an internal signal, and the other variable delay circuit generates a second signal by delaying a trailing edge of the internal signal. The output buffer includes: a first switching element which is connected between a line of an activating potential and an output terminal, and becomes conductive in response to the first signal; and a second switching element which is connected between a line of a reference potential and the output terminal, and becomes nonconductive in response to the second signal. Therefore, in this case, it is possible to readily adjust a delay time of the output buffer on the basis of the result whether or not the first or second fuses are blown out.

Further preferably, the inverter is used as an input first stage circuit of an input buffer of a semiconductor device. Therefore, in this case, it is possible to readily adjust a threshold potential of the input buffer.

Further preferably, the inverter is provided in a semiconductor memory device. The semiconductor memory device includes: a plurality of memory cells; a selector circuit for selecting any one of a plurality of the memory cells according to an address signal; and a sense amplifier for reading data of the memory cell selected by the selector circuit, and for outputting a level signal in accordance with the data. The inverter is used to make a detection whether or not an output signal level of the sense amplifier is higher than a threshold potential. Therefore, in this case, it is possible to readily adjust a threshold potential of the inverter for detecting an output signal level of the sense amplifier.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a circuit block diagram showing principal parts of a flash memory according to a sixth embodiment of the present invention;

FIGS. 15A to 15C are time charts showing operations of the variable delay circuit sown in FIG. 14;

FIG. 16 is a circuit block diagram showing a configuration of an output buffer of a flash memory according to a seventh embodiment of the present invention;

FIGS. 17A to 17F are time charts showing operations of the output buffer shown in FIG. 16;

FIGS. 19A and 19B are time charts showing operations of the inverter 75 shown in FIG. 18;

FIG. 20 is a block diagram showing a modified example of the eighth embodiment;

DETAILED DESCRIPTION OF THE PREFERRED EMBODIMENTS

[Embodiment 1]

Figure 1:
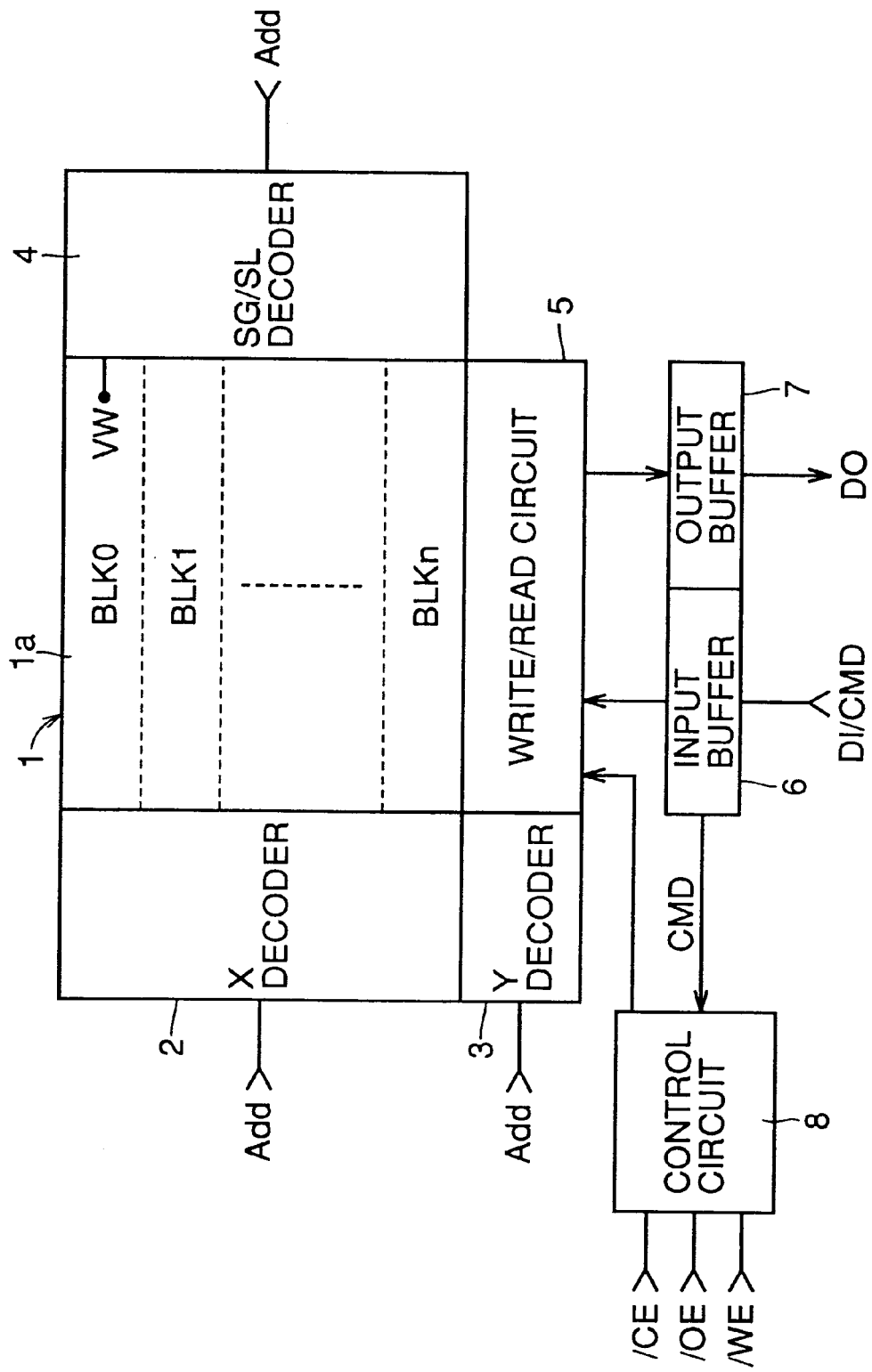
FIG. 1 is a block diagram showing a configuration of a flash memory according to a first embodiment of the present invention.

FIG. 1 is a block diagram showing a configuration of a flash memory according to a first embodiment of the present invention. As shown in FIG. 1, the flash memory includes a memory array 1, an X decoder 2, a Y decoder 3, an SG/SL decoder 4, a write/read circuit 5, an input buffer 6, an output buffer 7, and a control circuit 8.

Figure 2:
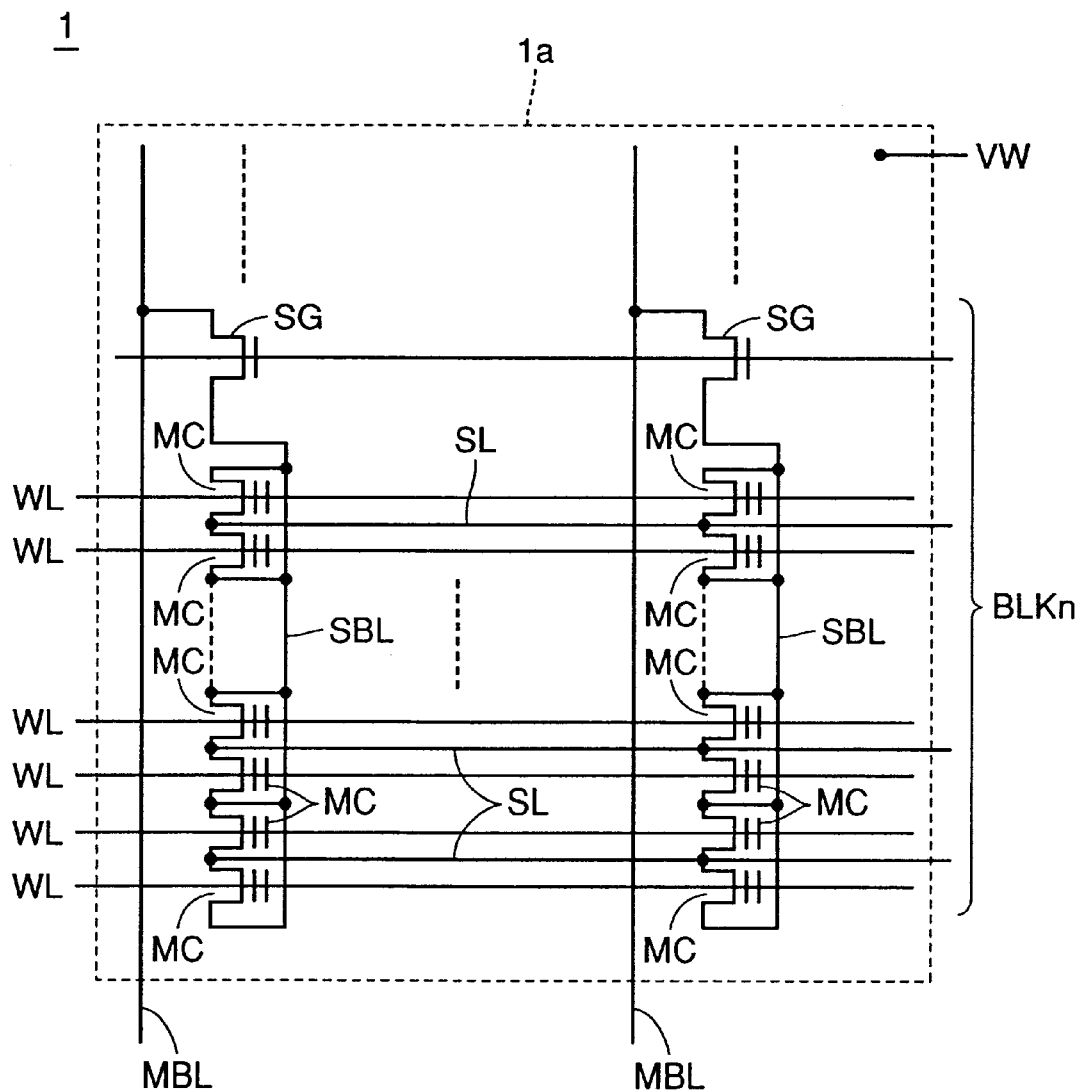
FIG. 2 is a circuit diagram showing a configuration of a memory array of the flash memory shown FIG. 1.

The memory array 1 includes a plurality of memory blocks BLK0 to BLKn (in this case, n is an integer bigger than 0) formed on the surface of a well 1a of a semiconductor substrate. A shown in FIG. 2, each of these memory blocks BLK0 to BLKn includes a plurality of memory cells MC which are arrayed in the form of plural rows and columns (in FIG. 2, only two rows are shown for simplification of the drawing), a word line WL arrayed corresponding to each row, a source line SL arrayed corresponding to each adjacent two rows, a secondary bit line SBL corresponding to each column and a select gate SG (N-channel MOS transistor). Moreover, a main bit line MBL is arrayed corresponding to each column in common to the memory blocks BLK0 to BLKn. Each secondary bit line SBL is connected to the main bit line MBL via the select gate SG.

Figure 3A:
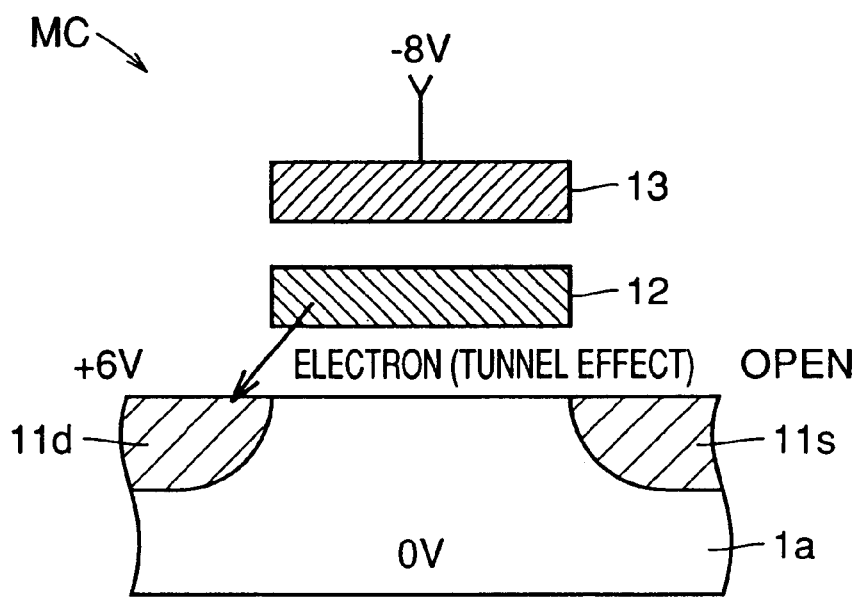
FIG. 3A and FIG. 3B are views to explain an operation of the memory cell shown in FIG. 2.
Figure 3B:
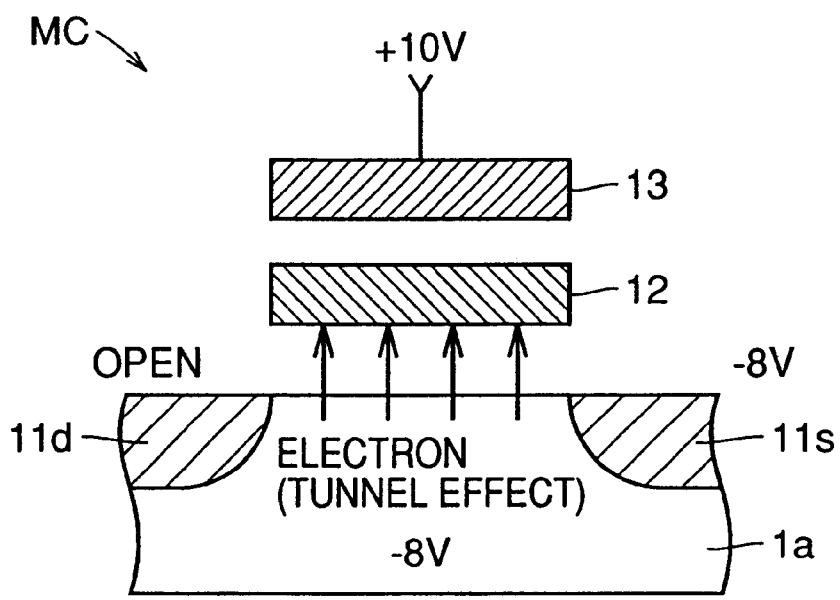

Each memory cell MC is formed as shown in FIGS. 3A and 3B. A floating gate 12 is formed above the surface of the well 1a via an insulating layer, and then, a control gate 13 is formed above the floating gate 12 via an insulating layer, and further, a source 11s and a drain 11d are individually formed on the surface of the well 1a at both sides of the gates 12 and 13. The control gate 13, drain 11d and source 11s are connected to the corresponding word line WL, secondary bit line SBL and source line SL, respectively.

Figure 4:
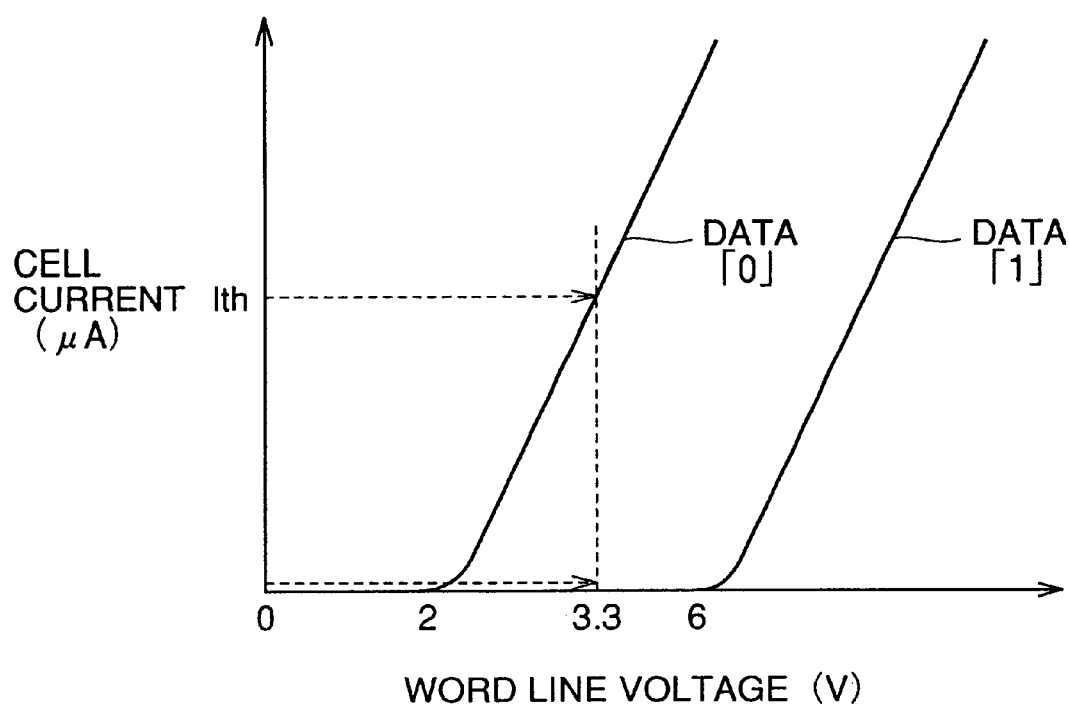
FIG. 4 is another view to explain an operation of the memory cell shown in FIG. 2.

In a writing operation, as shown in the uppermost column of Table 1, +6V and -8V are applied to the drain 11d and the control gate 13 of the memory cell MC, respectively, and then, the source 11s is made open (floating), and further, the well 1a is landed. By doing so, as shown in FIG. 3A, an electron is removed (drawn) from the floating gate 12 to the drain 11d by tunnel effect, and thereafter, as shown in FIG. 4, a threshold potential Vth of the memory cell MC is reduced to 2V. Namely, a data "0" is written in the memory cell MC.

TABLE 1

|       | drain | gate  | source | well |
|-------|-------|-------|--------|------|
| write | +6 V  | -8 V  | open   | 0 V  |
| erase | open  | +10 V | -8 V   | -8 V |
| read  | 1 V   | +3.3 V | 0 V   | 0 V  |

In an erasing operation, as shown in the middle column of Table 1, +10V is applied to the control gate 13 of the memory cell MC, and then, -8V is applied to the source 11s and the well 1a, and further, the drain 11d is opened. By doing so, as shown in FIG. 3B, an electron is implanted from the source 11s and the well 1a into the floating gate 12 by a tunnel effect, and thereafter, as shown in FIG. 4, a threshold potential Vth of the memory cell MC is increased to about 6V. Namely, a data "1" is written in the memory cell MC.

In a reading operation, as shown in the lowest column of Table 1, +1V is applied to the drain 11d of the memory cell MC, and +3.3V is applied to the control gate 13, and further, 0V is applied to the source 11s and the well 1a. By doing so, as shown in FIG. 4, a detection is made whether or not a threshold current Ith (usually, several 10 $\mu$A) flows between the drain 11a and the source 11s. In case that data "0" is written in the memory cell MC, the current Ith flows; while in case other than that, the current Ith does not flow.

Referring back to FIG. 1, the X decoder 2 selects any of a plurality of the word lines WL according to an address signal Add, and then, applies a voltage -8V, +10V and +3.3V to the selected word line WL in accordance with an operation mode. The Y decoder 3 selects any of a plurality of the main bit lines MBL according to the address signal Add.

The SG/SL decoder 4 selects any memory block (e.g., BLKn) of a plurality of the memory blocks BLK0 to BLKn according to the address signal Add, and then, turns a select gate SG of the selected memory block BLKn conductive so that each secondary bit line SBL of the selected memory block BLKn is coupled to the corresponding main bit line MBL. Further, the SG/SL decoder 4 sets a well potential VW as 0V or -8V in accordance with the operation mode, as well as sets the source line SL to an open state, at 0V or -8V.

In a writing operation, the write/read circuit 5 writes data into the memory cell MC selected by the decoders 2 to 4 according to data DI given from the external element via the input buffer 6. Moreover, in a reading operation, the write/read circuit 5 applies 1V to the drain 11d of the memory cell MC selected via the main bit line MBL selected by the decoder 3, the select gate SG and the secondary bit line SBL, and then, makes a detection whether or not a current flows, and further, outputs data DO corresponding to the detection result to the external element via the output buffer 7.

The control circuit 8 selects a predetermined operation mode according to control signals /CE, /OE and /WE given from the external element and a command signal CMD given from the external element via the input buffer 6, and then, controls the whole flash memory.

Next, the following is a description on an operation of the flash memory. First, the control signals /CE, /OE and /WE and the command signal CMD are given to the control circuit 8, and thus, an operation mode is set up.

In a writing operation, -8V is applied to the word line WL corresponding to the memory cell MC designated by the address signal Add, and then, the memory cell MC is connected to the main bit line MBL via the select gate SG so that the source line SL is set to an open state, and so that a well potential VW is set to 0V. In this state, the write/read circuit 5 applies +6V to the main bit line MBL, and then, data "0" is written into the selected memory cell MC.

In an erasing operation, the source line SL and the well potential VW are set to -8V. In this state, +10V is applied to a word line WL designated by the address signal Add, and then, data of the memory cell MC connected to the work line WL is erased.

In a reading operation, the memory cell MC designated by the address signal Add is connected to the write/read circuit 5 via the secondary bit line SLB, the select gate SG and the main bit line MBL, and then, +3.3V is applied to the word line WL corresponding to the memory cell MC. Data of the memory cell MC is read by the write/read circuit 5, and then, is outputted to the external element via the output buffer 7.

In such a flash memory as described above, many inverters are used in order to perform an external signal level detection, a signal transmission, a signal delay and the like. The following is a detailed description on a method of adjusting a threshold potential VTH for an inverter, which is constituent features of the present invention.

Figure 5:
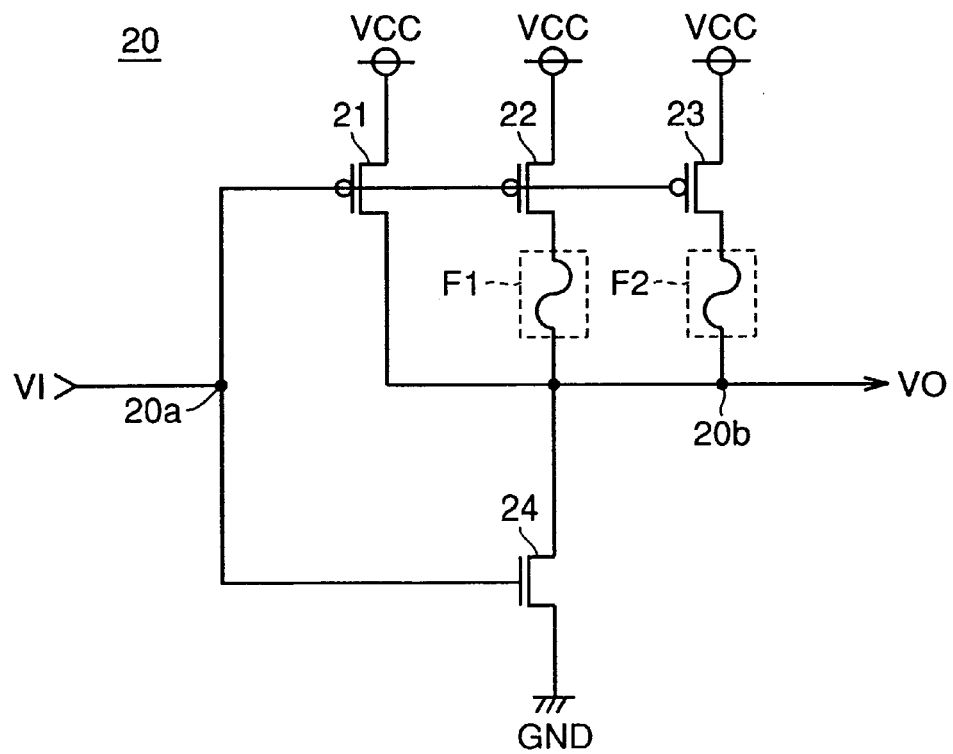
FIG. 5 is a circuit diagram showing a configuration of an inverter included in the flash memory shown in FIG. 1.

FIG. 5 is a circuit diagram showing a configuration of an inverter 20 included in the flash memory shown in FIG. 1. The inverter 20 is arranged on, for example an input first stage of the input buffer 6, and is used for detecting a level of an external data signal DI.

As shown in FIG. 5, this inverter 20 includes P-channel MOS transistors 21 to 23, an N-channel MOS transistor 24 and fuses F1 and F2. Sources of these P-channel MOS transistors 21 to 23 are connected to a source potential VCC line, and each gate thereof is connected to an input node 20a. A drain of the P-channel MOS transistor 21 is connected to an output node 20b, and each drain of the P-channel MOS transistors 22 and 23 is connected to the output node 20b via fuses F1 and F2. The N-channel MOS transistor 24 is connected between the output node 20b and a ground potential GDN line, and its gate is connected to the input node 20a. A current driving force of the P-channel MOS transistor 23 is set larger than that of the P-channel MOS transistor 22.

In case that an input signal VI is at an "H" level, the P-channel MOS transistors 21 to 23 become nonconductive, and the N-channel MOS transistor 24 becomes conductive, which makes an output signal VO an "L" level. In case that the input signal VI becomes lower than an "H" level, resistance value of the P-channel MOS transistors 21 to 23 becomes small, which makes a charging current Ic flowing to the output node 20b from the source potential VCC line via the P-channel MOS transistors 21 to 23 increased, at the same time, a resistance value of the N-channel MOS transistor 24 becomes large, which makes a discharge current Id flowing to the ground potential GDN line from the output node 20b via the N-channel MOS transistor 24 decreased. In case that the input signal VI becomes lower than a threshold potential VTH of the inverter 20, the charging current Ic becomes larger than the discharge current Id, which uses the output signal VO from an "L" level to an "H" level.

Conversely, in case that the input signal VI is at an "L" level, the P-channel MOS transistors 21 to 23 become conductive, and the N-channel MOS transistor 24 becomes nonconductive, which makes the output signal VO at an "H" level. In case that the input signal VI becomes higher than an "L" level, the resistance value of the N-channel MOS transistor 24 becomes small, which makes a discharge current Id flowing to the ground potential GND line from the output node 20b via the N-channel MOS transistors 24 increased, at the same time, each resistance value of the P-channel MOS transistors 21 to 23 becomes small, which makes a charging current Ic flowing to the output node 20b from the source potential VCC line via the P-channel MOS transistors 21 to 23 decreased. In case that the input signal VI becomes higher than a threshold potential VTH of the inverter 20, the discharge current Id becomes larger than the charging current Ic, which lowers the output signal VO from an "H" level to an "L" level.

Figure 6:
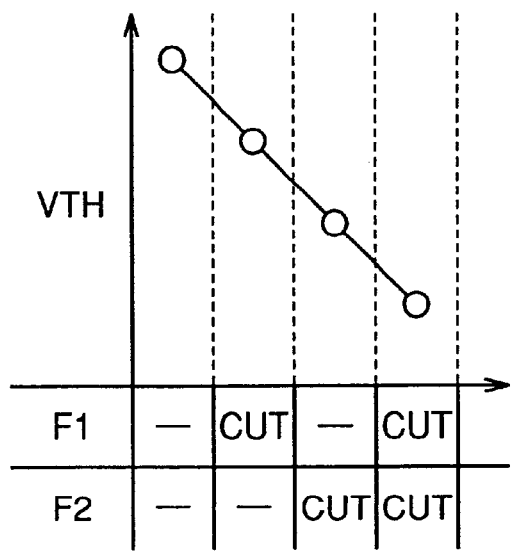
FIG. 6 is a view to explain a method of adjusting a threshold potential of the inverter shown in FIG. 5.

FIG. 6 is a view showing a relation between the threshold potential VTH of the inverter 20 shown in FIG. 5 and conditions of the fuses F1 and F2. In case that the fuses F1 and F2 are not blown out, the charging current Ic is the largest, which means the threshold potential Vth of the inverter 20 is the highest.

A current driving force of the P-channel MOS transistor 23 is set larger than that of the P-channel MOS transistor 22, which means the threshold potential VTH of the inverter 20 becomes lower in case that only the fuse F2 is blown out as compared with the case when only the fuse F1 is blown out. In case that the both fuses F1 and F2 are blown out, the threshold potential VTH of the inverter 20 becomes the lowest.

After the inverter 20 is completed, the threshold potential VTH of the inverter 20 is measured. Even in case that the threshold potential VTH is higher than its design value, it is possible to adjust the threshold value VTH to its design value by blowing out at least one of the fuses F1 and F2 with a laser beam based on the measurement result.

In this first embodiment, because the threshold potential VTH of the inverter 20 is adjusted by the presence of the blown-out of the fuses F1 and F2, it is possible to adjust the threshold potential VTH of inverter in a simple manner at a low cost as compared with the conventional case where a threshold potential of the inverter was adjusted by exchanging a mask in the middle of an inverter manufacture process. Moreover, because the threshold potential VTH is possible to be adjusted for each inverter separately, it is possible to adjust a threshold potential VTH of each inverter more accurately as compared with the conventional case when the threshold potentials VTH of a plurality of the inverters had to be adjusted at one time per each semiconductor substrate.

In addition, a capacitance of the input node 20a is constant regardless whether or not the fuses F1 and F2 are blown out; therefore, it is possible to readily set a size of the MOS transistor for driving the input signal VI. Moreover, in case where both fuses F1 and F2 are blown out, the P-channel MOS transistors 22 and 23 are separated from the output node 20b; therefore, a capacitance of the output node 20b becomes small.

[Embodiment 2]

Figure 7:
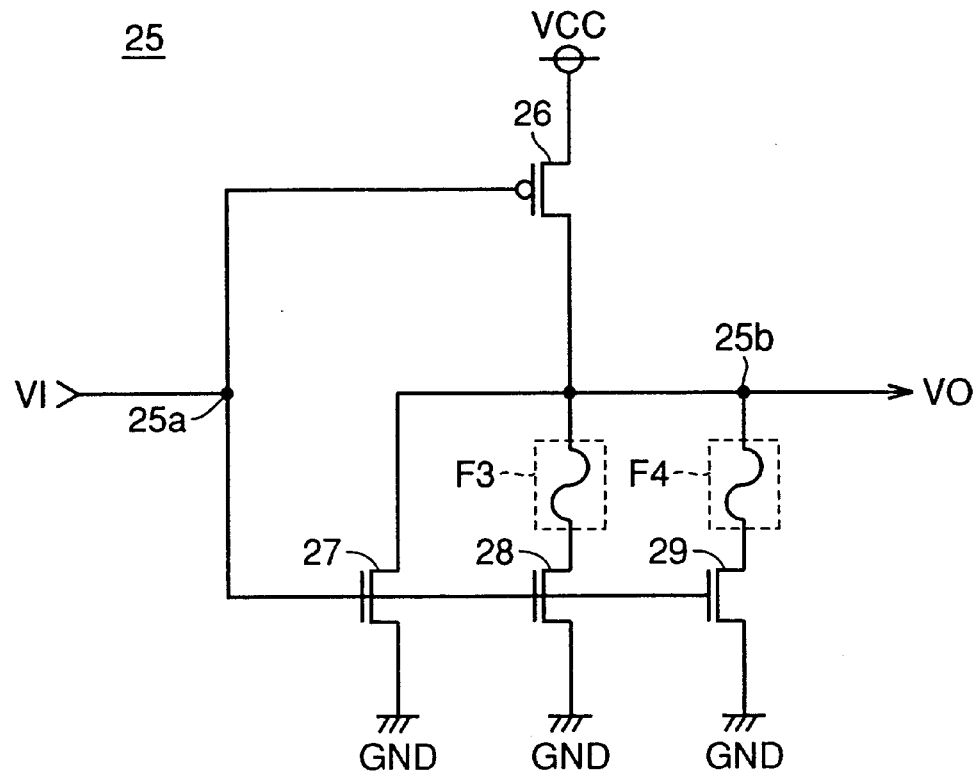
FIG. 7 is a circuit diagram showing a configuration of an inverter included in a flash memory according to a second embodiment of the present invention.

FIG. 7 is a circuit diagram showing a configuration of an inverter 25 included in a flash memory according to a second embodiment of the present invention. The inverter 25 is arranged on an input first stage of the input buffer 6, and is used for detecting a level of an external data signal D1.

As shown in FIG. 7, the inverter 25 includes a P-channel MOS transistor 26, N-channel MOS transistor 27 to 29 and fuses F3 and F4. The P-channel MOS transistor 26 is connected between a line of the source potential VCC and an output node 25b, and a gate of the channel MOS transistor 26 is connected to an input node 25a. The N-channel MOS transistors 26 to 29 are connected to a line of the ground potential GDN, and each gate thereof is connected to the output node 25a. A drain of the N-channel MOS transistor 27 is connected to the output node 25b, and each drain of the N-channel MOS transistors 28 and 29 are connected to the output node 25b via the fuses F3 and F4. A current driving force of the P-channel MOS transistor 29 is set larger than that of the P-channel MOS transistor 28.

In case where an input signal VI is at an "H" level, the P-channel MOS transistor 26 becomes nonconductive, and the N-channel MOS transistors 27 to 29 become conductive, which turns an output signal VO at an "L" level. When the input signal VI becomes lower than the "H" level, a resistance value of the P-channel MOS transistor 26 becomes small, which makes a charging current Ic flowing to the output node 25b from a line of the source potential VCC via the P-channel MOS transistor 26 increases. At the same time, each resistance value of the N-channel MOS transistors 27 to 29 becomes large; therefore, a discharge current Id flowing to a line of the ground potential GDN from the output node 25b via the N-channel MOS transistors 27 to 29 decreases. When the input signal VI becomes lower than a threshold potential VTH of the inverter 25, the charging current Ic becomes larger than the discharge current Id; therefore, the output signal VO rises from an "L" level to an "H" level.

Conversely, in case where then input signal VI is an "L" level, the P-channel MOS transistor 26 becomes conductive, and the N-channel MOS transistors 27 to 29 become nonconductive, and thus, the output signal VO becomes an "H" level. When the input signal VI becomes higher than an "L" level, each resistance value of the N-channel MOS transistors 27 to 29 becomes small; therefore, a discharge current Id flowing to a line of the ground potential GND from the output node 20b via the N-channel MOS transistors 27 to 29 increases. On the other hand, a resistance value of the P-channel MOS transistor 26 becomes small; therefore, a charging current Ic flowing to the output node 25b from a line of the source potential VCC via the P-channel MOS transistors 27 to 29 increases. When the input signal VI becomes higher than a threshold potential VTH of the inverter 25, the discharge current Id becomes larger than the charging current Ic; therefore, the output signal VO falls from an "H" level to an "L" level.

Figure 8:
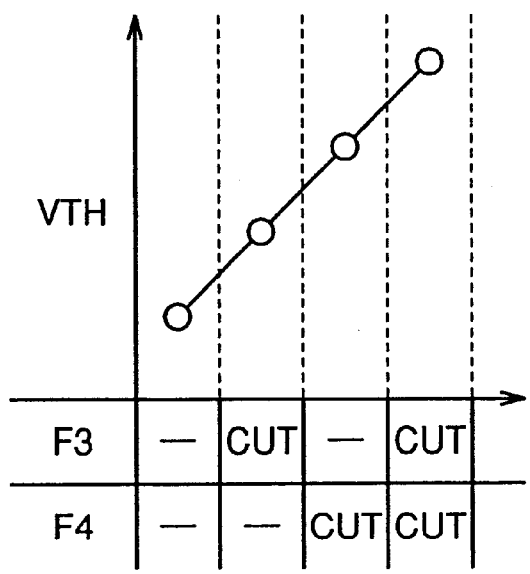
FIG. 8 is a view to explain a method of adjusting a threshold potential of the inverted shown in FIG. 7.

FIG. 8 is a view showing a relation between a threshold potential VTH of the inverter 25 shown in FIG. 7 and states of the fuses F3 and F4. In case where the fuses F3 and F4 are not blown out, the discharge current Id is the largest; therefore, a threshold potential VTH of the inverter 25 is the lowest.

A current driving force of the N-channel MOS transistor 29 is set larger than that of the N-channel MOS transistor 28; therefore, the threshold potential VTH of the inverter 25 becomes higher in case where only fuse F4 is blown out as compared with the case where only fuse F3 is blown out. In case where both fuses F3 and F4 are blown out, the threshold potential VTH of the inverter 25 becomes the highest.

After the inverter 25 is completed, the threshold potential VTH of the inverter 25 is measured. Even in case where the threshold potential VTH is higher than its design value, on the basis of the measurement result, at least one of the fuses F3 and F4 is blown out by a laser beam, and thereby, it is possible to approximate the threshold value VTH to the design value.

In this second embodiment, the same effect as the first embodiment can be obtained.

[Embodiment 3]

Figure 9:
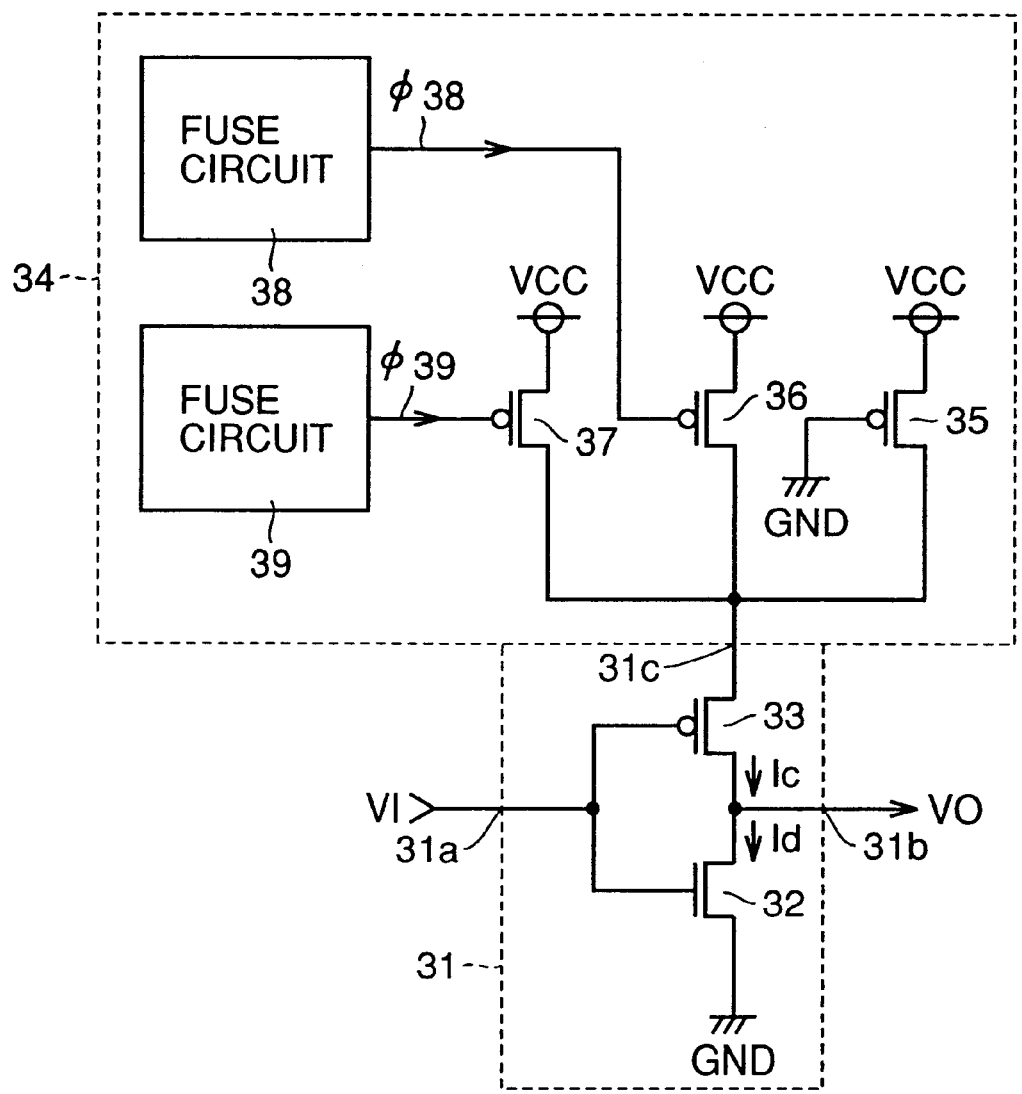
FIG. 9 is a circuit block diagram showing principal parts of a flash memory according to a third embodiment of the present invention.

FIG. 9 is a circuit block diagram showing principal parts of a flash memory according to a third embodiment of the present invention. As shown in FIG. 9, the flash memory includes an inverter 31 and a threshold setting circuit 34. The inverter 31 is used as an input first stage circuit of the input buffer 6.

The inverter 31 includes an N-channel MOS transistor 32 and a P-channel MOS transistor 33. The N-channel MOS transistor 32 is connected between a line of the ground potential GND and an output node 31b, and its gate is connected to an input node 31a. The P-channel MOS transistor 33 is connected between the output node 31b and a source node 31c, and its gate is connected to the input node 31a.

In case where an input signal VI is higher than a threshold potential VTH, a charging current Ic flowing through the P-channel MOS transistor 33 becomes smaller than a discharge current Id flowing through the N-channel MOS transistor 32; therefore, an output signal VO becomes an "L" level. On the other hand, in case where the input signal VI is lower than the threshold potential VTH, a charging current Ic flowing through the P-channel MOS transistor 33 becomes larger than the discharge current Id flowing through the N-channel MOS transistor 32; therefore, the output signal VO becomes an "H" level.

The threshold setting circuit 34 includes P-channel MOS transistors 35 to 37 and fuse circuits 38 and 39. The P-channel MOS transistors 35 to 37 are connected in parallel between a line of the source potential VCC and a source node 31c of the inverter 31. A gate of the P-channel MOS transistor 35 is grounded, and the P-channel MOS transistor 35 constitutes a resistor element. The gates of the P-channel MOS transistors 36 and 37 individually receive output signals φ38 and φ39 of the fuse circuits 38 and 39. A current driving force of the P-channel MOS transistor 37 is set larger than that of the P-channel MOS transistor 36. Moreover, a current driving force of the P-channel MOS transistor 33 is set larger than the total sum of current driving forces of the P-channel MOS transistors 35 to 37.

Figure 10:
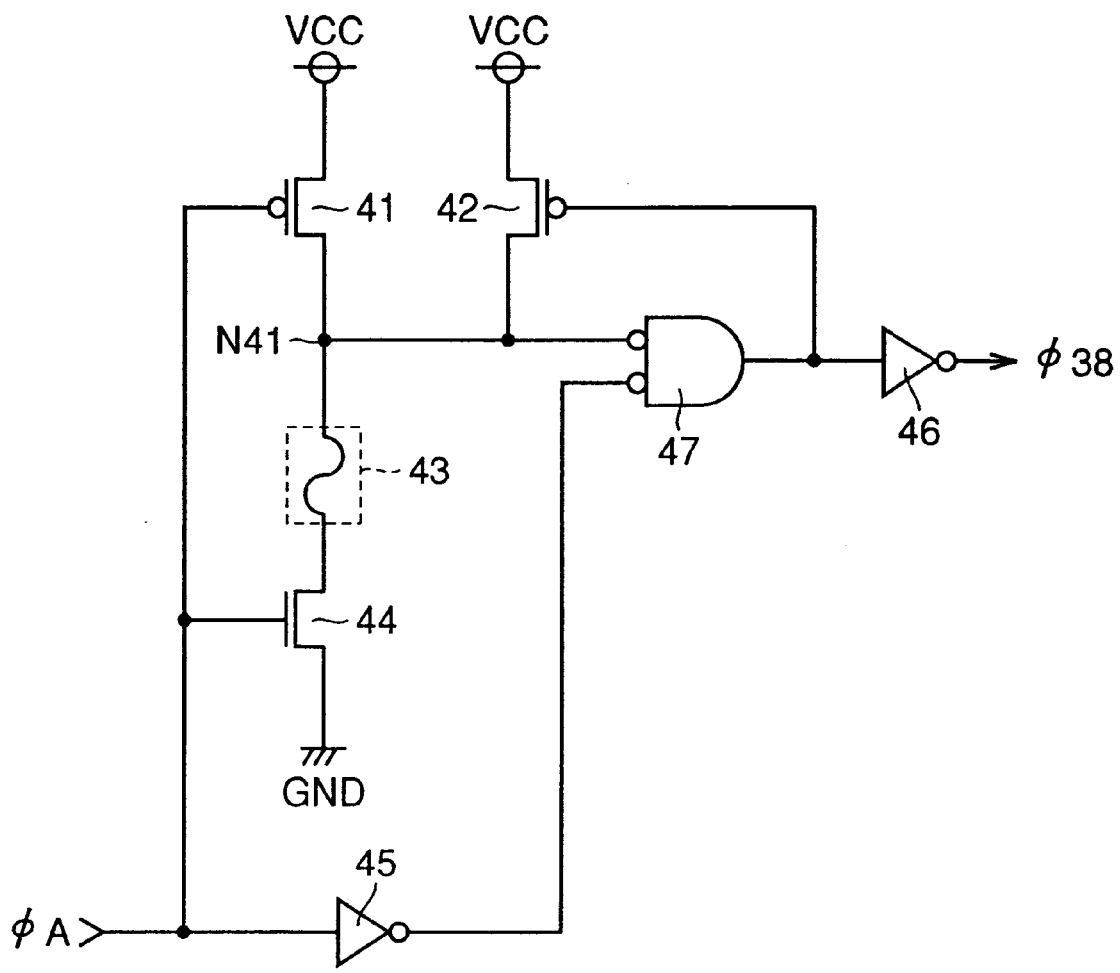
FIG. 10 is a block diagram showing a configuration of a fuse circuit shown in FIG. 9.

As shown in FIG. 10, the fuse circuit 38 includes P-channel MOS transistors 41 and 42, a fuse 43, an N-channel MOS transistor 44, inverters 45 and 36, and a NOR gate 47. The P-channel MOS transistors 41 and 42 are connected in parallel between a line of the source potential VCC and a node N41. The fuse 43 and the N-channel MOS transistor 44 are connected in series between the node N41 and a line of the ground potential GND. An activation signal φA is inputted directly to each gate of the MOS transistors 41 and 44, and then, is inputted to one input node of the NOR gate 47 via the inverter 45. Further, the activation signal φA is set to an "L" level when no inverter 31 is used, and is set to an "H" level when the inverter 31 is used. The other input node of the NOR gate 47 is connected to the node N41, and its output signal is inputted to a gate of the P-channel MOS transistor 42. The output signal of the NOR gate 47 is inverted by the inverter 46, and then, is used as the output signal φ38 of the fuse circuit 38.

The following is a description on an operation of the fuse circuit 38 in case where the fuse 43 is not blown out. In case where the activation signal φA is at an "L" level, an output signal of the inverter 45 becomes an "H" level, and then, an output signal of the NOR gate 47 becomes an "L" level; therefore, the output signal φ38 becomes an "H" level. In this case, the P-channel MOS transistors 41 and 42 become conductive, and the N-channel MOS transistor 44 becomes nonconductive; therefore, the node N41 becomes an "H" level.

When the activation signal φA rises to an "H" level, the output signal of the inverter 45 becomes an "L" level, and then, the NOR gate 47 operates as an inverter with respect to a signal occurring in the node N41. Moreover, the P-channel MOS transistor 41 becomes nonconductive, and the N-channel MOS transistor 44 becomes conductive, and further, a current driving force of the P-channel MOS transistor 42 is set smaller; therefore, the node N41 becomes an "L" level. Whereby an output signal of the NOR gate 47 becomes an "H" level, and then, the P-channel MOS transistor 42 becomes nonconductive; as a result, the output signal φ38 becomes an "L" level.

Next, the following is a description on an operation of the fuse circuit 38 in case where the fuse 44 is blown out. In case where the activation signal φA is an "L" level, the signal φ38 becomes an "L" level in the same manner as the case where the fuse is not blown out. When the activation signal φA rises to an "H" level, the output signal of the inverter 45 becomes an "L" level, and then, the NOR gate 47 operates as an inverter with respect to a signal occurring in the node N41. Moreover, the P-channel MOS transistor 41 becomes nonconductive, and the N-channel MOS transistor 44 becomes conductive. However, the fuse 43 is blown out; therefore, the node N41 is unchanged as it is an "H" level. Thus, the output signal φ38 is unchanged as it is an "H" level.

After all, the output signal φ38 of the fuse circuit 38 becomes an "L" level only in case where the fuse 43 is not blown out and the signal φA rises to an "H" level. The configuration and operation of the fuse circuit 39 is the same as the fuse circuit 38.

The threshold potential VTH of the inverter 31 is variable in a similar way as the threshold potential VTH of the inverter 20 shown in FIGS. 5 and 6. More specifically, in case where the fuse circuit 38 and the fuse 43 of the fuse circuit 39 are not blown out, a charging current Ic is the largest; therefore, the threshold potential VTH of the inverter 31 is the highest.

A current driving force of the P-channel MOS transistor 37 is set larger than that of the P-channel MOS transistor 36; therefore, the threshold potential VTH of the inverter 31 becomes lower in case where only fuse of the fuse circuit 39 is blown out as compared with the case where only fuse 43 of the fuse circuit 38 is blown out. In case where both fuse circuits 38 and 39 are blown out, the threshold potential VTH of the inverter 31 becomes the lowest.

The inverter 31 and the threshold setting circuit 34 are completed, and thereafter, the threshold potential VTH of the inverter 31 is measured. Even in case where the threshold potential VTH is higher than a design value, on the basis of the measurement result, the fuse 43 of at least one of the fuse circuits 38 and 39 is blown out by a laser beam, and thereby, it is possible to adapt the threshold value VTH to a design value.

In this third embodiment, the same effect as the above first embodiment can be obtained.

In this third embodiment, when the fuse 43 of the fuse circuits 38 and 39 is blown out, the P-channel MOS transistors 36 and 37 become nonconductive. An inverter may be provided between the output nodes of the fuse circuits 38 and 39 and between the gates of the P-channel MOS transistors 36 and 37 so that the P-channel MOS transistors 36 and 37 become conductive when the fuse 43 of the fuse circuits 38 and 39 is blown out.

[Embodiment 4]

Figure 11:
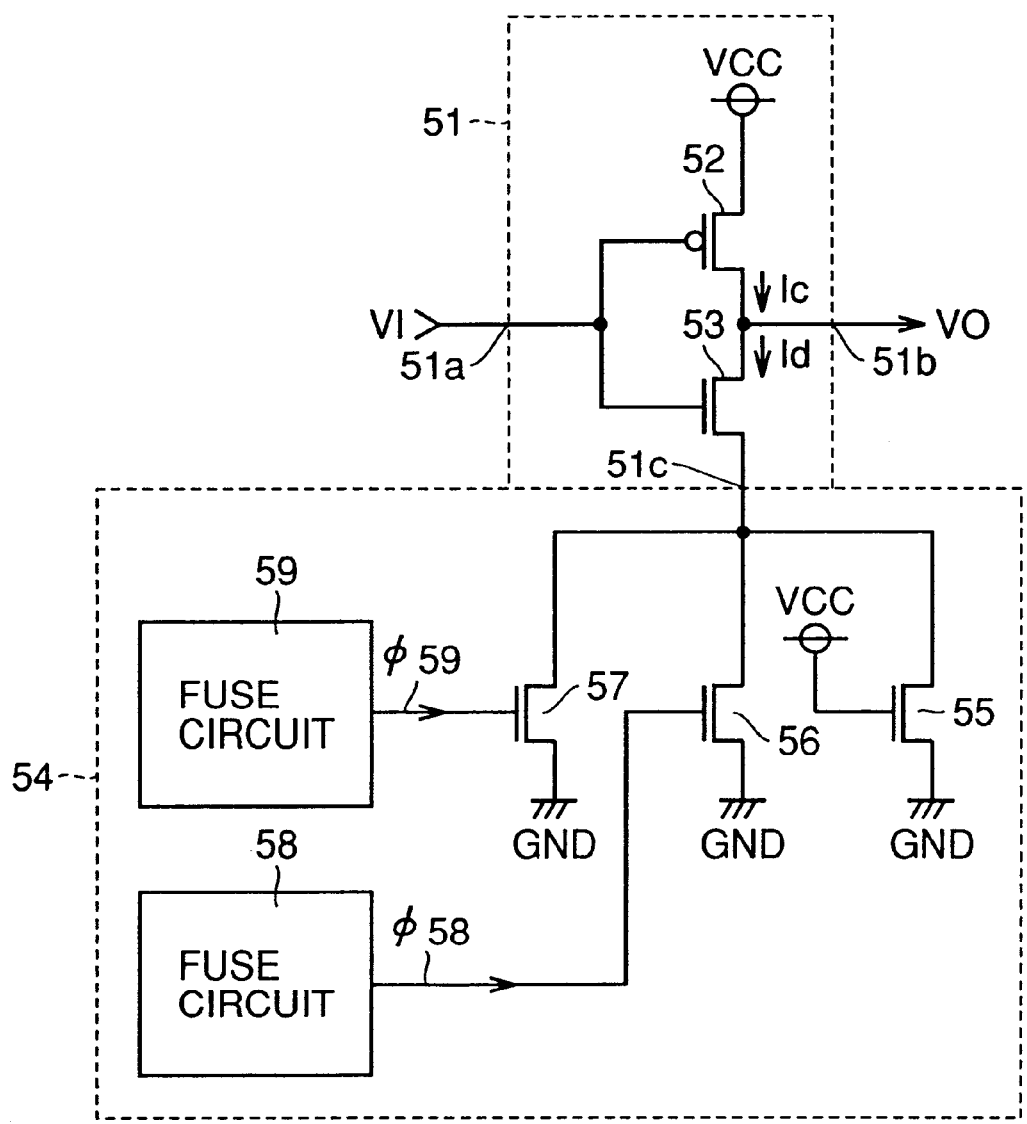
FIG. 11 is a circuit block diagram showing principal parts of a flash memory according to a fourth embodiment of the present invention.

FIG. 11 is a circuit block diagram showing principal parts of a flash memory according to a fourth embodiment of the present invention. As shown in FIG. 11, the flash memory includes an inverter 51 and a threshold setting circuit 54. The inverter 51 is used as an input first stage circuit of the input buffer 6.

The inverter 51 includes a P-channel MOS transistor 52 and an N-channel MOS transistor 53. The P-channel MOS transistor 52 is connected between a line of the ground potential GND and an output node 51b, and its gate is connected to an input node 51a. The N-channel MOS transistor 53 is connected between the output node 51b and a ground node 51c, and its gate is connected to the input node 51a.

In case where an input signal VI is higher than a threshold potential VTH, a charging current Ic flowing through the P-channel MOS transistor 52 becomes smaller than a discharge current Id flowing through the N-channel MOS transistor 53; therefore, an output signal VO becomes an "L" level. On the other hand, in case where the input signal VI is lower than a threshold potential VTH, a charging current Ic flowing through the P-channel MOS transistor 52 becomes larger than a discharge current Id flowing through the N-channel MOS transistor 53; therefore, the output signal VO becomes an "H" level.

The threshold setting circuit 54 includes N-channel MOS transistors 55 to 57 and fuse circuits 58 and 59. The N-channel MOS transistors 55 to 57 are connected in parallel between the ground node 51c of the inverter 51 and a line of the ground potential GND. A gate of the N-channel MOS transistor 55 receives a source potential VCC, and the N-channel MOS transistor 55 constitutes a resistor element. The gates of the N-channel MOS transistors 56 and 57 receive output signals φ58 and φ59 of fuse circuits 58 and 59. A current driving force of the N-channel MOS transistor 57 is set larger than that of the N-channel MOS transistor 56. Moreover, a current driving force of the N-channel MOS transistor 53 is set larger than the total sum of current driving forces of the N-channel MOS transistors 55 to 57.

Figure 12:
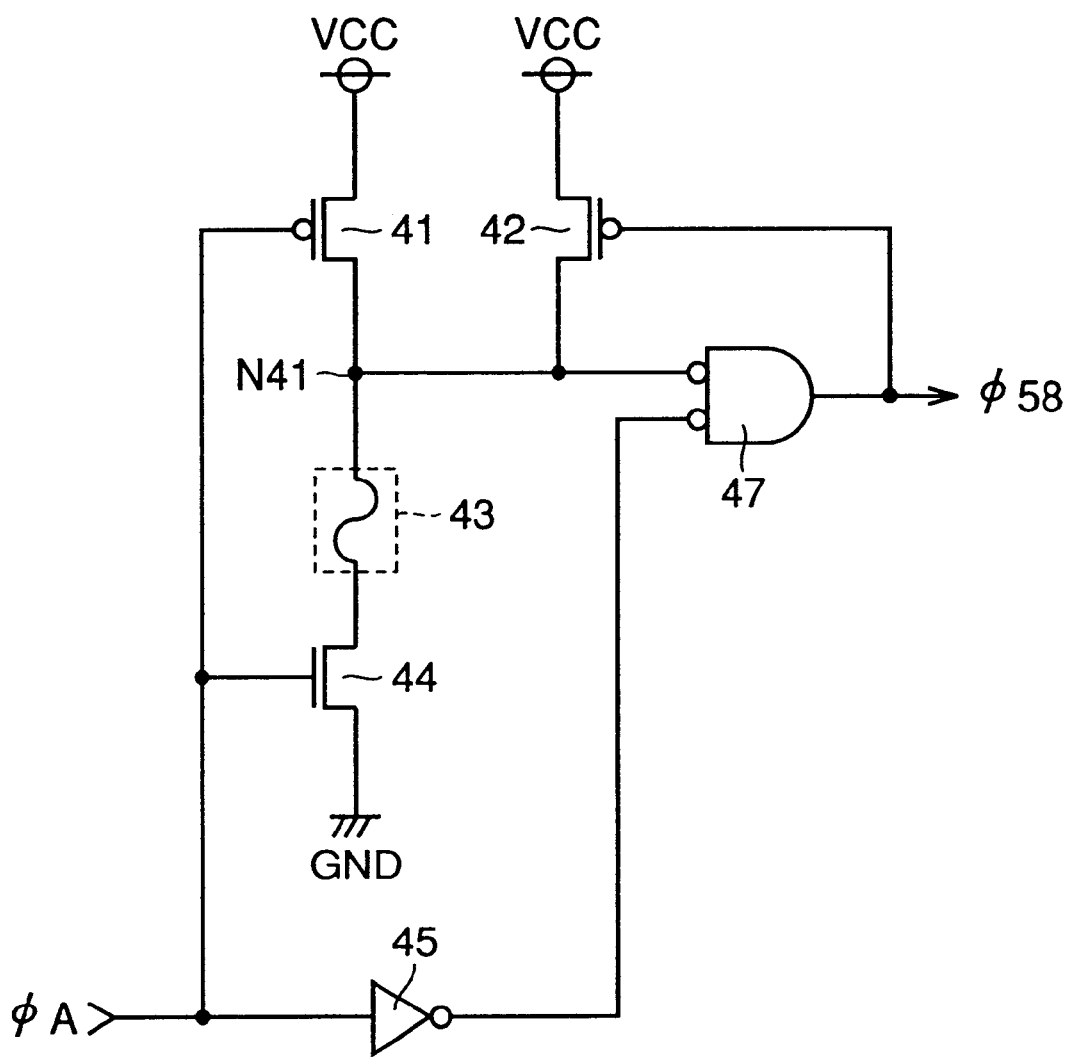
FIG. 12 is a block diagram showing a configuration of a fuse circuit shown in FIG. 11.

As shown in FIG. 12, in the fuse circuit 58, the inverter 46 is deleted from the fuse circuit 38 shown in FIG. 10. An output signal of the NOR gate 47 becomes an output signal φ58 of the fuse circuit 58. Therefore, the output signal φ58 becomes a complementary symmetry signal of the signal φ38.

More specifically, in case where the fuse 43 is not blown out, when the activation signal φA is an "L" level, the output signal φ58 becomes an "L" level. On the other hand, in case where the activation signal φA is an "H" level, the output signal φ58 becomes an "H" level. In case where the fuse 43 is blown out, the output signal φ58 becomes an "L" level regardless of the activation signal φA. After all, the output signal φ58 of the fuse circuit 58 becomes an "H" level only in case where the fuse 43 is not blown out, and the activation signal φA is an "H" level, and becomes an "L" level in other cases. The configuration and operation of the fuse circuit 59 is the same as the fuse circuit 58.

The threshold potential VTH of the inverter 51 is variable like the threshold potential VTH of the inverter 25 shown in FIG. 7 and FIG. 8. More specifically, in case where the fuse 43 of the fuse circuits 58 and 59 is not blown out, a discharge current Id is the largest; therefore, the threshold potential VTH of the inverter 51 is the lowest.

A current driving force of the N-channel MOS transistor 57 is set larger than that of the N-channel MOS transistor 56; therefore, the threshold potential VTH of the inverter 51 becomes higher in case where only fuse of the fuse circuit 59 is blown out as compared with the case where only fuse 43 of the fuse circuit 58 is blown out. In case where both fuse circuits 58 and 59 are blown out, the threshold potential VTH of the inverter 31 becomes the highest.

The inverter 51 and the threshold setting circuit 54 are completed, and thereafter, the threshold potential VTH of the inverter 51 is measured. Even in case where the threshold potential VTH is lower than a design value, on the basis of the measurement result, the fuse 43 of at least one of the fuse circuits 58 and 59 is blown out by a laser beam, and thereby, it is possible to adapt the threshold value VTH to a design value.

In this fourth embodiment, the same effect as the above first embodiment can be obtained.

In this fourth embodiment, when the fuse 43 of the fuse circuits 58 and 59 is blown out, the N-channel MOS transistors 56 and 57 become nonconductive. An inverter may be provided between the output nodes of the fuse circuits 58 and 59 and between the gates of the N-channel MOS transistors 56 and 57 so that the N-channel MOS transistors 56 and 57 become conductive when the fuse 43 of the fuse circuits 58 and 59 is blown out.

[Embodiment 5]

Figure 13:
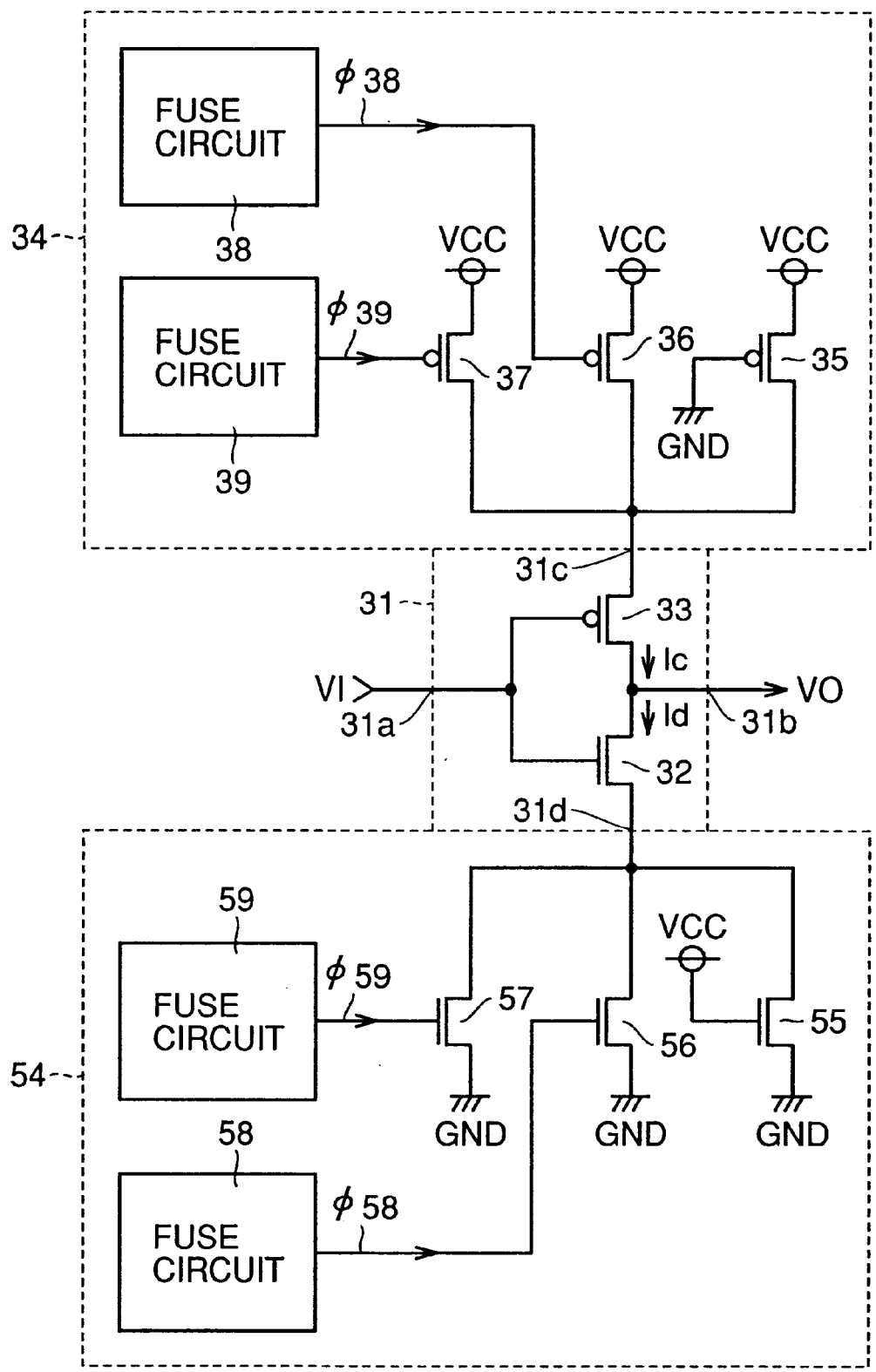
FIG. 13 is a circuit block diagram showing principal parts of a flash memory according to a fifth embodiment of the present invention.

FIG. 13 is a circuit block diagram showing principal parts of a flash memory according to a fifth embodiment of the present invention. Referring now to FIG. 13, the flash memory according to the fifth embodiment is different from the flash memory shown in FIG. 9 in that the threshold setting circuit 54 shown in FIG. 1 is added thereto. The threshold setting circuit 54 is connected to the ground node 31d of the inverter 31.

In case where the fuse 43 of the fuse circuits 38, 39, 58 and 59 is not blown out and the activation signal φA becomes an "H" level, the output signals φ38 and φ39 become an "L" level; therefore, the P-channel MOS transistors 36 and 37 become conductive. On the other hand, the output signals φ58 and φ59 become an "H" level; therefore, the N-channel MOS transistors 56 and 57 become conductive, and thereby, a current driving force of the inverter 31 becomes the maximum.

The inverter 31 and the threshold setting circuits 34 and 54 are completed, and thereafter, the threshold potential VTH of the inverter 31 is measured. In case where the threshold potential VTH is higher than a design value, on the basis of the measurement result, the fuse 43 of at least one of the fuse circuits 38 and 39 is blown out by a laser beam, and thereby, it is possible to adapt the threshold value VTH to a design value. In case where the threshold potential VTH is lower than a design value, on the basis of the measurement result, the fuse 43 of at least one of the fuse circuits 58 and 59 is blown out by a laser beam, and thereby, it is possible to adapt the threshold value VTH to a design value In this fifth embodiment, the same effect as the above first embodiment can be obtained.

[Embodiment 6]

FIG. 14 is a circuit block diagram showing principal parts of a flash memory according to a sixth embodiment of the present invention.

As shown in FIG. 14, the flash memory includes a variable delay circuit having even-numbered (e.g., four in FIG. 14) inverters 31.1 to 31.4 which are connected in series, and threshold setting circuits 34.1, 34.2, 54.1 and 54.2. Each of the inverters 31.1 to 31.4 is the same as the inverter 31 shown in FIG. 13. Each of the threshold setting circuits 34.1 and 34.2 is the same as the threshold setting circuit 34 shown in FIG. 13. Each of the threshold setting circuits 54.1 and 54.2 is the same as the threshold setting circuit 45 shown in FIG. 13.

The threshold setting circuit 34.1 is connected to a source node of odd-numbered stage inverters 31.1 and 31.3. The threshold setting circuit 34.2 is connected to a source node of even-numbered stage inverters 31.2 and 31.4. The threshold setting circuit 54.1 is connected to a ground node of odd-numbered stage inverters 31.1 and 31.3. The threshold setting circuit 54.2 is connected to a ground node of even-numbered stage inverters 31.2 and 31.4.

When the fuse 43 of the fuse circuits 38 and 39 included in the threshold setting circuit 34.1, each threshold potential VTH of the inverters 31.1 and 31.3 becomes low. When the fuse 43 of the fuse circuits 38 and 39 included in the threshold setting circuit 34.2, each threshold potential VTH of the inverters 31.2 and 31.4 becomes low.

When the fuse 43 of the fuse circuits 58 and 59 included in the threshold setting circuit 54.1, each threshold potential VTH of the inverters 31.1 and 31.3 becomes high. When the fuse 43 of the fuse circuits 58 and 59 included in the threshold setting circuit 54.2, each threshold potential VTH of the inverters 31.2 and 31.4 becomes high.

Each of FIG. 15A to FIG. 15C is a time chart showing an input signal VI and an output signal VO of the variable delay circuit 60 shown in FIG. 14.

The variable delay circuit G 0 and the threshold setting circuits 34.1, 34.2, 54.1 and 54.2 is completed, and thereafter, a time until the output signal VO rises from an "L" level to an "H" level after the input signal VI rises from "L" level to an "H" level, that is, a delay time T1 of the variable delay circuit 60 is measured.

In case where the delay time T1 is shorter than a design value, the fuse 43 of at least one of the fuse circuits 58 and 59 included in the threshold setting circuit 54.1 is blown out so as to make high each threshold potential VTH of the inverters 31.1 and 31.3, and further, the fuse 43 of at least one of the fuse circuits 38 and 39 included in the threshold setting circuit 34.2 is blown out so as to make low each threshold potential VTH of the inverters 31.2 and 31.4. By doing so, as shown in FIG. 15C, the delay time T1 is made long so as to be adapted to a design value.

Conversely, in case where the delay time T1 is longer than a design value, the fuse 43 of at least one of the fuse circuits 38 and 39 included in the threshold setting circuit 34.1 is blown out so as to make low each threshold potential VTH of the inverters 31.1 and 31.3, and further, the fuse 43 of at least one of the fuse circuits 58 and 59 included in the threshold setting circuit 54.2 is blown out so as to make high each threshold potential VTH of the inverters 31.2 and 31.4. By doing so, as shown in FIG. 15C, the delay time T1 is made short so as to be adapted to a design value.

[Embodiment 7]

FIG. 16 is a circuit block diagram showing a configuration of an output buffer 61 of a flash memory according to a seventh embodiment of the present invention.

As shown in FIG. 16, the output buffer 61 includes variable delay circuits 62 and 63, threshold setting circuits 34.1, 34.2, 54.1 and 54.2, a NAND gate 64, a NOR gate 65, a P-channel MOS transistor 66 and an N-channel MOS transistor 67.

Each of the variable delay circuits 62 and 63 is the same as the variable delay circuit 60 shown in FIG. 60. The threshold setting circuits 34.1, 34.2, 54.1 and 54.2 are the same as those shown in FIG. 13, and are provided in common to the variable delay circuits 62 and 63. Therefore, the fuse 43 of the threshold setting circuits 34.1, 34.2, 54.1 and 54.2 is blown out, and thereby, it is possible to adjust a delay time T62 and a delay time T63 of the variable delay circuits 62 and 63.

An input signal VI is inputted directly to one input node of the NAND gate 64, and is inputted to the other input node of the NAND gate 64 via the variable delay circuit 62. Moreover, the input signal VI is inputted directly to one input node of the NOR gate 65, and is inputted to the other input node of the NOR gate 65 via the variable delay circuit 63. The P-channel MOS transistor 66 is connected between a line of the source potential VCC and an output node 61a, and its gate receives an output signal φ64 of the NAND gate 64. The N-channel MOS transistor 67 is connected between the output node 61a and a line of the ground potential GND, and its gate receives an output signal φ65 of the NOR gate 65. Each of FIG. 17A to FIG. 17F is a time chart showing an operation of the output buffer 61 shown in FIG. 16. In an initial state, the input signal VI becomes an "L" level, and both signals φ64 and φ65 become an "H" level. Thus, the P-channel MOS transistor 66 becomes nonconductive, and the N-channel MOS transistor 67 becomes conductive; therefore, the output signal VO becomes an "L" level.

When the input signal VI rises from an "L" level to an "H" level at a certain time, the signal φ65 becomes an "L" level; therefore, the N-channel MOS transistor 67 becomes nonconductive. At this time, both MOS transistors 66 and 67 becomes nonconductive; therefore, the output signal VO is unchanged as it is an "L" level.

Then, when the input signal VI becomes an "H" level, after the delay time T62 of the variable delay circuit 62 elapses, the signal φ64 becomes an "L" level, and then, the P-channel MOS transistor 66 becomes conductive, and thus, the output signal VO rises from an "L" level to an "H" level.

Next, when the input signal VI falls from an "H" level to an "L" level, the signal φ64 becomes an "H" level; therefore, the P-channel MOS transistor 66 becomes nonconductive. At this time, both MOS transistors 66 and 67 becomes nonconductive; therefore, the output signal VO is unchanged as it is an "H" level.

Then, when the input signal VI becomes an "L" level, after the delay time T63 of the variable delay circuit 63 elapses, the signal φ65 becomes an "H" level, and then, the N-channel MOS transistor 67 becomes conductive, and thus, the output signal VO falls from an "H" level to an "L" level.

In case where the delay times T62 and T63 are shorter than a design value, the fuse 43 of at least one of the fuse circuits 58 and 59 included in the threshold setting circuit 54.1 is blown out, and further, the fuse 43 of at least one of the fuse circuits 38 and 39 included in the threshold setting circuit 34.2 is blown out. By doing so, the delay times T62 and T63 are made long so as to be adapted to a design value.

Conversely, in case where the delay times T62 and T63 are longer than a design value, the fuse 43 of at least one of the fuse circuits 38 and 39 included in the threshold setting circuit 34.1 is blown out, and further, the fuse 43 of at least one of the fuse circuits 58 and 59 included in the threshold setting circuit 54.2 is blown out. By doing so, the delay times T62 and T63 are made short so as to be adapted to a design value.

[Embodiment 8]

Figure 18:
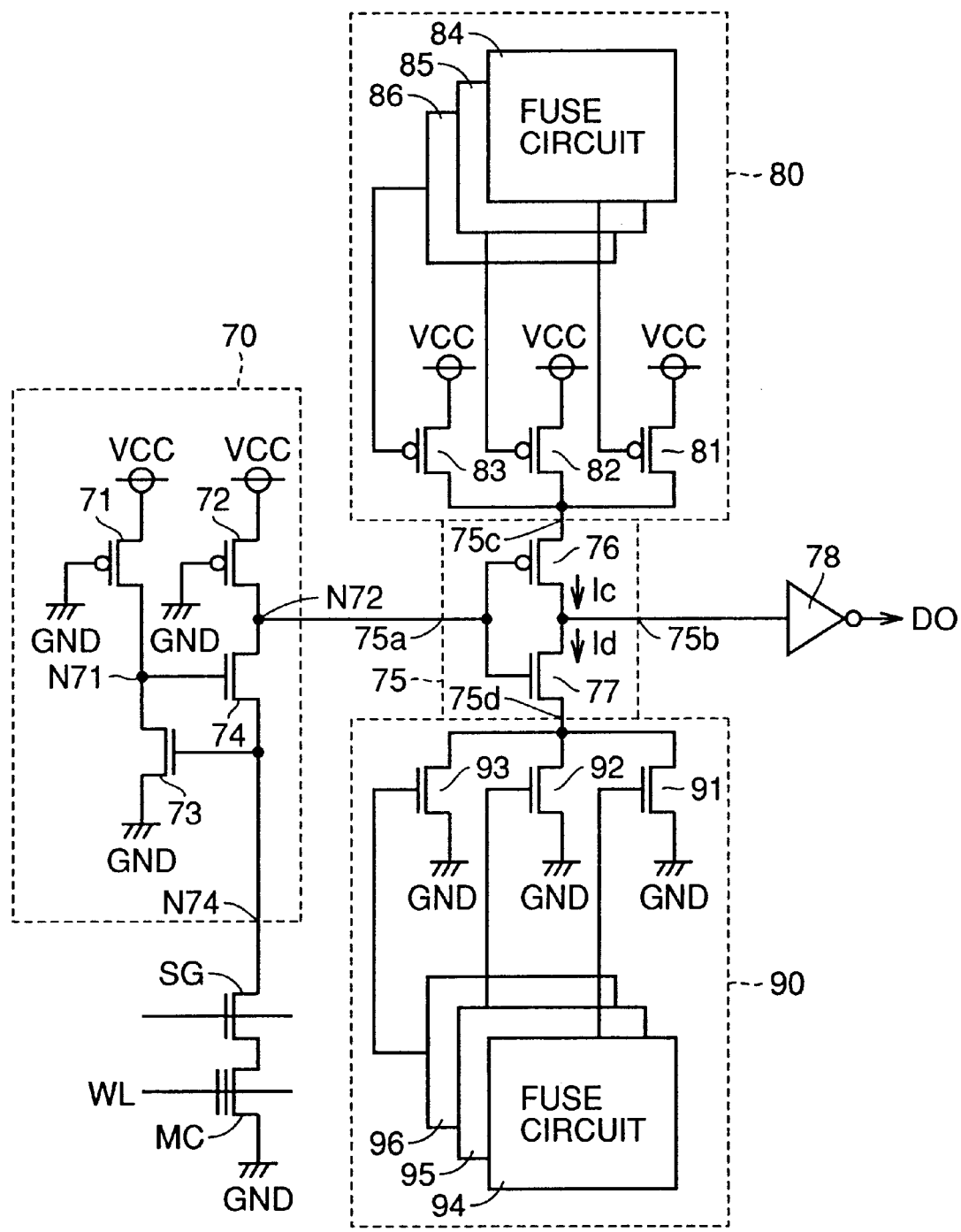
FIG. 18 is a circuit block diagram showing a configuration of a part relative to data reading of a flash memory according to an eighth embodiment of the present invention.

FIG. 18 is a circuit block diagram showing a configuration of a part relative to data read of a flash memory according to an eighth embodiment of the present invention. As shown in FIG. 18, the flash memory includes a sense amplifier 70, inverters 75 and 78, and threshold setting circuits 80 and 90.

The sense amplifier 70 includes P-channel MOS transistors 71 and 72, and N-channel MOS transistors 73 and 74. The P-channel MOS transistors 71 and 72 are connected between a line of the source potential VCC and nodes N 71 and 72, and their gates are both grounded. Further, these P-channel MOS transistors 71 and 72 constitute a resistor element. The N-channel MOS transistor 73 is connected between the node N71 and a line of the ground potential GND, and its gate is connected to a node N74. The N-channel MOS transistor 74 is connected between the nodes N72 and N74, and its gate is connected to the node N71. The node N74 is connected to a line of the ground potential GND via a select gate SG and a memory cell MC. A data "0" is written in the memory cell MC.

In case where the memory cell MC is not selected, the select gate SG and the memory cell MC become nonconductive. In this case, each of the nodes N72 and N74 become an "H" level, and the N-channel MOS transistor 73 becomes conductive; on the other hand, the node 71 becomes an "L" level, and the N-channel MOS transistor 74 becomes nonconductive.

When the memory cell MC is selected, the select gate SG and the memory cell MC become conductive; therefore, the node N74 becomes an "L" level. Whereby the N-channel MOS transistor 73 becomes nonconductive, and then, the node N71 becomes an "H" level, and further, the N-channel MOS transistor 74 becomes conductive; therefore, the node N72 falls from an "H" level to an "L" level.

The inverter 75 includes a P-channel MOS transistor 76 and an N-channel MOS transistor 77. The P-channel MOS transistor 76 is connected between a source node 75c and an output node 75b, and its gate is connected to an input node 75a. The N-channel MOS transistor 77 is connected between the output node 75b and a ground node 75d, and its gate is connected to the input node 75a.

In case where the input node 75a is higher than a threshold potential VTH of the inverter 75, a charging current Ic flowing through the P-channel MOS transistor 76 becomes smaller than a discharge current Id flowing through the N-channel MOS transistor 77, and then, the output node 75b becomes an "L" level. In case where the input node 75a is lower than a threshold potential VTH of the inverter 75, a charging current Ic flowing through the P-channel MOS transistor 76 becomes larger than a discharge current Id flowing through the N-channel MOS transistor 77, and then, the output node 75b becomes an "H" level. Therefore, an output signal of the inverter 75 is inverted by the inverter 78, and thus, is outputted as a read data signal DO.

The threshold setting circuit 80 includes P-channel MOS transistors 81 to 83 and fuse circuits 84 to 86. The P-channel MOS transistors 81 to 83 are connected in parallel between a line of the source potential VCC and a source node 75c of the inverter 75, and their gates receive outputs of fuse circuits 84 to 86. Each of these fuse circuits 84 to 86 is the same as the fuse circuit 38 shown in FIG. 10. Each current driving force of the P-channel MOS transistors 81 to 83 is set to a value different from each other. Moreover, a current driving force of the P-channel MOS transistor 76 is set larger than the total sum of the current driving forces of the P-channel MOS transistors 81 to 83.

In case where the fuse 43 of the fuse circuits 84 to 86 is not blown out, all of the P-channel MOS transistors 81 to 83 become conductive, and then, a charging current Ic becomes the maximum; therefore, a threshold potential VTH of the inverter 75 is the highest. When the fuse 43 of at least one of the fuse circuits 84 to 86 is blown out, at least one of the P-channel MOS transistors 81 to 83 becomes nonconductive, and then, a charging current Ic becomes small; therefore, the threshold potential VTH of the inverter 75 becomes low.

The threshold setting circuit 90 includes N-channel MOS transistors 91 to 93 and fuse circuits 94 to 96. The N-channel MOS transistors 91 to 93 are connected in parallel between a ground node 75d of the inverter 75 and a line of the ground potential GND, and their gates receive outputs of fuse circuits 94 to 96. Each of these fuse circuits 94 to 96 is the same as the fuse circuit 58 shown in FIG. 12. Each current driving force of the N-channel MOS transistors 91 to 93 is set to a value different from each other. Moreover, a current driving force of the N-channel MOS transistor 77 is set larger than the total sum of the current driving forces of the N-channel MOS transistors 91 to 93.

In case where the fuse 43 of the fuse circuits 94 to 96 is not blown out, all of the N-channel MOS transistors 91 to 93 become conductive, and then, a discharge current Id becomes the maximum; therefore, a threshold potential VTH of the inverter 75 is the lowest. When the fuse 43 of at least one of the fuse circuits 84 to 86 is blown out, at least one of the P-channel MOS transistors 91 to 93 becomes nonconductive, and then, a discharge current Id becomes small; therefore, the threshold potential VTH of the inverter 75 becomes high.

Each of FIG. 19A and FIG. 19B is a time chart showing each potential change of the input node 75a and the output node 75b of the inverter 75 shown in FIG. 18.

The memory cell MC is selected, and then, when the node N74 of the sense amplifier 70 rises from an "H" level to an "L" level, the N-channel MOS transistor 73 becomes nonconductive, and the node N71 becomes an "H" level. Further, the N-channel MOS transistor becomes conductive, and then, the node N72, that is, the input node 75a of the inverter 75 falls from an "H" level to an "L" level. When the input node 75a of the inverter 75 becomes lower than a threshold potential VTH, a charging current Ic becomes larger than a discharge current Id; therefore, the output node 75b rises from an "L" level to an "H" level. Whereby the output data signal DO becomes an "L" level; therefore, it is found that a data "0" has been written in the selected memory cell MC.

At this time, a threshold potential VTH of the inverter 75 is measured. In case where the threshold potential VTH is higher than a design value, on the basis of the measurement result, the fuse 43 of at least one of the fuse circuits 84 to 86 is blown out by a laser beam, and thereby, it is possible to adapt the threshold potential VTH to a design value. Moreover, in case where the threshold potential VTH is lower than a design value, on the basis of the measurement result, the fuse 43 of at least one of the fuse circuits 94 to 96 is blown out by a laser beam, and thereby, it is possible to adapt the threshold potential VTH to a design value.

In this eighth embodiment, the same effect as the above first embodiment can be obtained.

In this eighth embodiment, each of the MOS transistors 81 to 83 and 91 to 93 has been provided with the fuse circuit. As shown in FIG. 20, for example, three fuse circuits 101 to 103 and a decoder 104 are provided in common to these MOS transistors 81 to 83 and 91 to 93. The output signals of the fuse circuits 101 to 103 are decoded by the decoder 104 so as to generate signals φ1 to φ6, and then, these signals φ1 to φ6 thus generated may be given to MOS transistors 81 to 83 and 91 to 93, respectively. Each output signal of the fuse circuits 101 to 103 is set to 8 ways, that is, 000, 001, . . ., 111. The decoder 104 makes each of the MOS transistors 81 to 83 and 91 to 93 conductive or nonconductive according to the output signals of the fuse circuits 101 to 103. Therefore, according to this modification example, it is possible to change a threshold potential VTH of the inverter 75 to 8 ways by three fuse circuits.

Figure 21A:
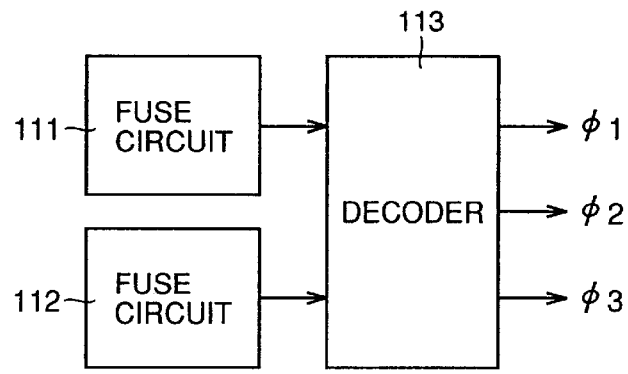
FIGS. 21A and 21B are block diagrams showing another modified example of the eighth embodiment.
Figure 21B:
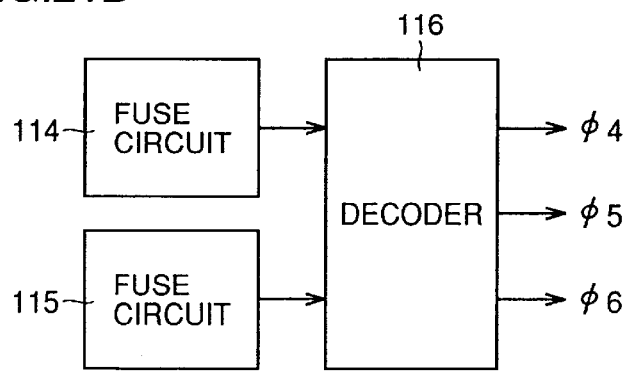
Figure 22:
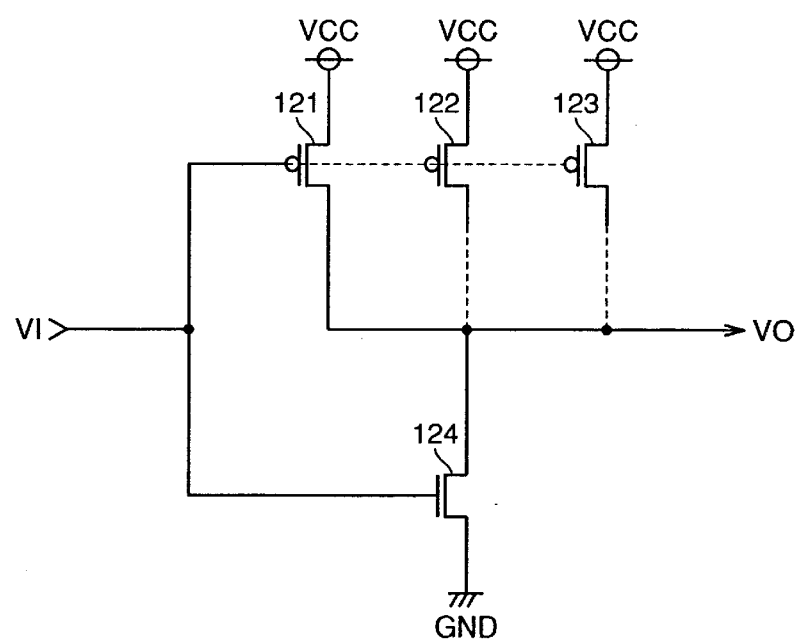
FIG. 22 is a view to explain a method of adjusting a threshold potential of a conventional inverter.

Moreover, as shown in FIG. 21A and FIG. 21B, two fuse circuits 111 and 112 and a decoder 113 may be provided in common to the P-channel MOS transistors 81 to 83, and two fuse circuits and a decoder 116 may be provided in common to the N-channel MOS transistors 91 to 93. Each output signal of the fuse circuits 111 and 112 is set to 4 ways, that is, 00, 01, 10 and 11. The decoder 113 generates signals φ1 to φ3 according to the output signals of the fuse circuits 111 and 112 and then, gives these signals φ1 to φ3 to each gate of the P-channel MOS transistors 81 to 83 so as to make each of the P-channel MOS transistors 81 to 83 conductive or nonconductive.

Moreover, Each output signal of the fuse circuits 114 and 115 is set to 4 ways, that is, 00, 01, 10 and 11. The decoder 116 generates signals φ4 to φ6 according to the output signals of the fuse circuits 114 and 115 and then, gives these signals φ4 to φ6 to each gate of the N-channel MOS transistors 91 to 93 so as to make each of the N-channel MOS transistors 91 to 93 conductive or nonconductive. Therefore, according to this modification example, it is possible to change a threshold potential VTH of the inverter 75 to 16 ways=4×4 by four fuse circuits 111, 112, 114 and 115.

The embodiments disclosed in this invention are examples in all points, and are not limited to them. The scope of the present invention is expressed by claims and not the above description, and various modifications may be made within meanings and rages uniform with the scope of claims.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An inverter which generates an inverted signal of an inputted signal to an input node and outputs the inverted signal to an output node, comprising:

a first transistor of a first conductive type connected between a line of a first source potential and said output node, and having an input electrode connected to said input node;

a second transistor of a second conductive type connected between a line of a second source potential and said output node, and having an input electrode connected to said input node;

a third transistor of the second conductive type having a first electrode connected to said line of the second source potential, and having an input electrode connected to said input node; and a fuse connected between a second electrode of said third transistor and said output node, and for shifting a threshold potential of said inverter in its level to said first source potential side by being blown out.

2. The inverter according to claim 1, wherein said third transistor and said fuse are provided in plural sets, and current driving forces of a plurality of the third transistors are set to values different from each other.

3. The inverter according to claim 1, wherein said inverter is used as an input first stage circuit of an input buffer of a semiconductor device.

4. The inverter according to claim 1, wherein said inverter is provided in a semiconductor memory device, said semiconductor memory device includes:

a plurality of memory cells;

a selector circuit for selecting any one of said plurality of memory cells according to an address signal; and a sense amplifier for reading a data of the memory cell selected by said selector circuit, and outputting a signal having a level in accordance with the data, and said inverter is used for detecting whether or not the level of the output signal of said sense amplifier is higher than said threshold potential.

5. An inverter which generates an inverted signal of an inputted signal to an input node and outputs the inverted signal to an output node, comprising:

a first transistor of a first conductive type having a first electrode connected to a line of a first source potential, a second electrode connected to said output node, and an input electrode connected to said input node;

a second transistor of a second conductive type having a first electrode connected to said output node and an input electrode connected to said input node;

a first variable resistor circuit connected between a second electrode of said second transistor and a line of a second source potential; and a first threshold setting circuit including at least one first fuse, and by setting a resistance value of said first variable resistor circuit based on the result whether or not said first fuse is blown out, setting a threshold potential of said inverter.

6. The inverter according to claim 5, wherein said first variable resistor circuit include a plurality of third transistors of second conductive type which are connected in parallel between the second electrode of said second transistor and said line of the second source potential, and said first threshold setting circuit make each of the third transistors conductive or nonconductive based on the result whether or not said first fuse is blown out.

7. The inverter according to claim 6, wherein current driving forces of a plurality of said third transistors are set to values different from each other.

8. The inverter according to claim 6, wherein said first fuse is provided so as to correspond to each third transistor, and said first threshold setting circuit make the corresponding third transistor conductive or nonconductive in accordance with the result that said first fuse is blown out.

9. The inverter according to claim 6, wherein said first fuse is provided by a number less than the number of said third transistors, said first threshold setting circuit include a first decoder which outputs a plurality of first control signals of the same numbers as the third transistors on the basis of the result whether or not the first fuse is blown out, and said plurality of the third transistors become conductive or nonconductive in response to a plurality of said first control signals, respectively.

10. The inverter according to claim 5, wherein said inverter further includes: second variable resistor circuit which is interposed between the first electrode of said first transistor and said line of the first source potential; and a second threshold setting circuit including at least one second fuse, and by setting a resistance value of said second variable resistor circuit based on the result whether or not said second fuse is blown out, setting a threshold potential of said inverter.

11. The inverter according to claim 10, wherein said second variable resistor circuit include a plurality of fourth transistors of the first conductive type which are connected in parallel between the first electrode of said first transistor and said line of the first source potential, and said second threshold setting circuit makes each of a plurality of the fourth transistors conductive or nonconductive based on the result whether or not said second fuse is blown out.

12. The inverter according to claim 11, wherein current driving forces of a plurality of said fourth transistors are set to values different from each other.

13. The inverter according to claim 11, wherein said second fuse is provided so as to correspond to each of the fourth transistors, and said second threshold setting circuit makes the corresponding fourth transistor conductive or nonconductive in accordance with the result that said second fuse is blown out.

14. The inverter according to claim 11, wherein said second fuse is provided by a number less than a number of said fourth transistors, said second threshold setting circuit include a second decoder which outputs a plurality of second control signals of the same numbers as said fourth transistors based on the result whether or not said second fuse is blown out, and a plurality of said fourth transistors become conductive or nonconductive in response to a plurality of said second control signals, respectively.

15. The inverter according to claim 10, wherein said inverter is provided in plural numbers, and a plurality of inverters are connected in series so as to constitute a variable delay circuit.

16. The inverter according to claim 15, wherein said first and second variable resistor circuit and the first and second threshold setting circuit of inverters other than first and second stage inverters among a plurality of said inverters are omitted, a first electrode of a first transistor of an odd-numbered-stage inverter is connected to a first electrode of a first transistor of said first stage inverter, a second electrode of a second transistor of said odd-numbered-stage inverter is connected to a second electrode of a second transistor of said first stage inverter, a first electrode of a first transistor of an even-numbered-stage inverter is connected to a first electrode of a first transistor of said second stage inverter, and a second electrode of a second transistor of said even-numbered-stage inverter is connected to a second electrode of a second transistor of said second stage inverter.

17. The inverter according to claim 15, wherein said two variable delay circuits are provided in an output buffer of a semiconductor device, one variable delay circuit generates a first signal by delaying a leading edge of an internal signal, the other variable delay circuit generates a second signal by delaying a trailing edge of the internal signal, and said output buffer includes:

a first switching element connected between a line of an activating potential and an output terminal, and becoming conductive in response to said first signal; and a second switching element connected between a line of a reference potential and said output terminal, and becoming nonconductive in response to said second signal.

18. The inverter according to claim 5, wherein said inverter is used as an input first stage circuit of an input buffer of a semiconductor device.

19. The inverter according to claim 5, wherein said inverter is provided in a semiconductor memory device, said semiconductor memory device includes:

a plurality of memory cells;

a selector circuit for selecting any one of said plurality of memory cells according to an address signal; and a sense amplifier for reading a data of the memory cell selected by said selector circuit, and for outputting a signal having a level in accordance with the data, and said inverter is used for detecting whether or not the level of the output signal of said sense amplifier is higher than said threshold potential.

* * * * *

UNITED STATES PATENT AND TRADEMARK OFFICE
CERTIFICATE OF CORRECTION

PATENT NO. : 6,327,211 B1  Page 1 of 1
DATED : December 4, 2001
INVENTOR(S) : Yoshihide Kai et al.

It is certified that error appears in the above-identified patent and that said Letters Patent is hereby corrected as shown below:

<u>Title page,</u>
Item "[30], Foreign Application Priority Data", change the priority application number "12-174845" to -- 2000-174845 --.

Signed and Sealed this

Fourth Day of June, 2002

*Attest:*

*Attesting Officer*

JAMES E. ROGAN
*Director of the United States Patent and Trademark Office*